(12) United States Patent
Noh et al.

(10) Patent No.: US 9,508,766 B2
(45) Date of Patent: Nov. 29, 2016

(54) IMAGE SENSORS AND METHODS OF FABRICATING THE SAME

(71) Applicant: Samsung Electronics Co., Ltd., Suwon-si (KR)

(72) Inventors: HyunPil Noh, Seongnam-si (KR); Dong-Chul Lee, Suwon-si (KR); Seokha Lee, Hwaseong-si (KR); Chan Park, Yongin-si (KR); Seungho Shin, Asan-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/813,182

(22) Filed: Jul. 30, 2015

(65) Prior Publication Data
US 2016/0035774 A1  Feb. 4, 2016

(30) Foreign Application Priority Data
Jul. 31, 2014  (KR) .................. 10-2014-0098251

(51) Int. Cl.
*H01L 27/00* (2006.01)
*H01L 27/146* (2006.01)

(52) U.S. Cl.
CPC ..... *H01L 27/14614* (2013.01); *H01L 27/1463* (2013.01); *H01L 27/14603* (2013.01); *H01L 27/14616* (2013.01); *H01L 27/14623* (2013.01); *H01L 27/14689* (2013.01); *H01L 27/14621* (2013.01); *H01L 27/14627* (2013.01)

(58) Field of Classification Search
None
See application file for complete search history.

(56) References Cited

U.S. PATENT DOCUMENTS

| 5,432,363 A * | 7/1995 | Kamisaka ......... H01L 27/14831 257/229 |
| 5,565,374 A * | 10/1996 | Fukusho ........... H01L 27/14806 257/E27.153 |
| 5,668,390 A * | 9/1997 | Morimoto ......... H01L 29/76808 257/221 |
| 6,312,969 B1 | 11/2001 | Abe |

(Continued)

FOREIGN PATENT DOCUMENTS

JP          3413358 B2     1/2000
KR    10-0783791 B1    12/2007

(Continued)

OTHER PUBLICATIONS

Michihiro Morimoto et al., "A 1-Inch 2-M Pixel HDTV CCD Image Sensor with Tungsten Photo-Shield and H-CCD Shunt Wiring," IEEE Transactions on Electron Devices, vol. 42, No. I, Jan. 1995, pp. 50-57.

*Primary Examiner* — Evren Seven
(74) *Attorney, Agent, or Firm* — Myers Bigel, P.A.

(57) ABSTRACT

An image sensor includes a photoelectric conversion element in a substrate, a first storage region spaced apart from the photoelectric conversion element in the substrate, a gate on the first storage region, a light shielding layer covering the gate, a dielectric layer disposed between the gate and the light shielding layer and extending onto a top surface of the substrate, an interlayer insulating structure covering the light shielding layer, and a micro-lens overlapping with the photoelectric conversion element on the interlayer insulating structure. The light shielding layer includes a first portion covering a sidewall of the gate, and a second portion on a top surface of the gate. The first portion has a first thickness corresponding to a vertical height from a bottom surface of the first portion to a top surface of the first portion, and the first thickness is greater than a second thickness of the second portion.

20 Claims, 42 Drawing Sheets

(56) References Cited

U.S. PATENT DOCUMENTS

| | | |
|---|---|---|
| 6,933,488 B2 | 8/2005 | Pain |
| 7,075,164 B2 * | 7/2006 | Uya ................. H01L 27/14623 257/431 |
| 7,153,719 B2 | 12/2006 | Patrick et al. |
| 7,361,877 B2 | 4/2008 | McGrath et al. |
| 7,414,233 B2 | 8/2008 | Asaba |
| 7,642,581 B2 | 1/2010 | Inoue |
| 7,745,859 B2 | 6/2010 | Hirata et al. |
| 7,897,928 B2 | 3/2011 | Kaufmann et al. |
| 7,910,872 B2 | 3/2011 | Kim et al. |
| 7,915,654 B2 | 3/2011 | Park |
| 8,072,520 B2 | 12/2011 | Rysinski |
| 8,115,848 B2 | 2/2012 | Onuki et al. |
| 8,129,765 B2 | 3/2012 | Kim et al. |
| 8,482,642 B2 | 7/2013 | Rysinski |
| 8,598,640 B2 | 12/2013 | Kitano et al. |
| 8,605,181 B2 | 12/2013 | Maes et al. |
| 8,716,719 B2 | 5/2014 | Matsumura et al. |
| 8,716,761 B2 | 5/2014 | Jang |
| 2003/0025160 A1 * | 2/2003 | Suzuki ............. H01L 27/14609 257/347 |
| 2007/0099371 A1 | 5/2007 | Jeon |
| 2010/0078744 A1 * | 4/2010 | Wano ................ H01L 27/14629 257/432 |
| 2011/0031575 A1 | 2/2011 | Nakagawa et al. |
| 2011/0242376 A1 * | 10/2011 | Ando ................ H01L 27/14623 348/294 |
| 2012/0025059 A1 * | 2/2012 | Kawashima ...... H01L 27/14623 250/208.1 |
| 2012/0052615 A1 | 3/2012 | Huo et al. |
| 2012/0112254 A1 * | 5/2012 | Nagano ............. H01L 27/14818 257/292 |
| 2012/0301989 A1 * | 11/2012 | Hashimoto ............. H01L 31/18 438/57 |
| 2013/0001724 A1 * | 1/2013 | Masuda ............ H01L 27/14623 257/432 |
| 2014/0077283 A1 * | 3/2014 | Lenchenkov ..... H01L 27/14609 257/292 |
| 2014/0078359 A1 * | 3/2014 | Lenchenkov ..... H01L 27/14627 348/294 |

FOREIGN PATENT DOCUMENTS

| | | |
|---|---|---|
| KR | 10-0873293 B1 | 12/2008 |
| KR | 10-1016497 B1 | 2/2011 |

* cited by examiner

IMAGE SENSORS AND METHODS OF FABRICATING THE SAME

CROSS-REFERENCE TO RELATED APPLICATION

This U.S. non-provisional patent application claims priority under 35 U.S.C. §119 to Korean Patent Application No. 10-2014-0098251, filed on Jul. 31, 2014, in the Korean Intellectual Property Office, the disclosure of which is hereby incorporated by reference in its entirety.

BACKGROUND

The inventive concepts relate to image sensors and methods of fabricating the same. More particularly, the inventive concepts relate to image sensors including a shutter gate and methods of fabricating the same.

An image sensor is a semiconductor device that converts an optical image into an electrical signal. Image sensors may be categorized as any one of charge coupled device (CCD) image sensors and complementary metal-oxide-semiconductor (CMOS) image sensors. CIS is short for the CMOS image sensor. The CIS may include a plurality of pixels two-dimensionally arranged. Each of the pixels may include a photodiode that converts incident light into an electrical signal.

As applications with high dynamic range are being demanded, additional gates may be used to increase functional operations (e.g., electronic shuttering, etc.) of the pixels.

SUMMARY

Embodiments of the inventive concepts may provide image sensors capable of improving shuttering efficiency.

Embodiments of the inventive concepts may also provide methods of fabricating an image sensor with improved sensitivity.

In one aspect, an image sensor may include: a substrate; a photoelectric conversion element disposed in the substrate; a first storage region disposed in the substrate and spaced apart from the photoelectric conversion element; a gate disposed on the first storage region; a light shielding layer covering the gate; a dielectric layer disposed between the gate and the light shielding layer and extending onto a top surface of the substrate; an interlayer insulating structure covering the light shielding layer on the substrate; and a micro-lens disposed on the interlayer insulating structure and overlapping with the photoelectric conversion element. The light shielding layer may include: a first portion covering a sidewall of the gate; and a second portion disposed on a top surface of the gate. The first portion of the light shielding layer may have a first thickness corresponding to a vertical height from a bottom surface of the first portion to a top surface of the first portion. The first thickness of the first portion of the light shielding layer may be greater than a second thickness of the second portion of the light shielding layer.

In another aspect, a method of fabricating an image sensor may include: forming a gate on a substrate including a pixel region and a peripheral circuit region; forming a dielectric layer covering a surface of the gate on the substrate; removing the dielectric layer of the peripheral circuit region to expose a dopant region formed in the substrate of the peripheral circuit region; forming a silicide layer on the dopant region; forming an interlayer insulating layer having an opening overlapping with the gate covered with the dielectric layer; performing an etch-back process to recess the dielectric layer exposed by the opening; and forming a light shielding layer by filling the opening with a metal material.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
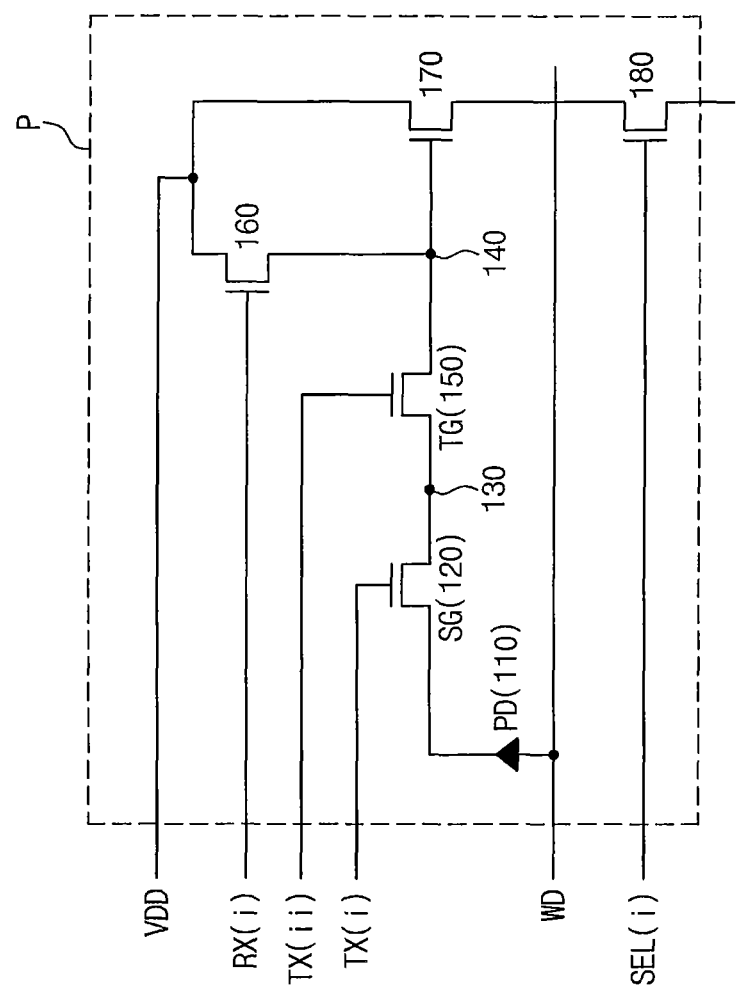
FIG. 1 is a circuit diagram illustrating a unit pixel of an active pixel sensor (APS) array of an image sensor according to example embodiments of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 is a circuit diagram illustrating a unit pixel of an active pixel sensor (APS) array of an image sensor according to example embodiments of the inventive concepts.

Referring to FIG. 1, a unit pixel P including five NMOS transistors may include a photoelectric conversion element 110 receiving light to generate photo-charges, and reading elements reading an optical signal (e.g., light) incident on the photoelectric conversion element 110. The reading elements may include a reset element 160, an amplification element 170, and a selection element 180.

The photoelectric conversion element 110 may convert the incident light into charges and may accumulate the generated charges. The photoelectric conversion element 110 may include a photo diode, a photo transistor, a photo gate, a pinned photo diode (PPD), or any combination thereof.

The photoelectric conversion element 110 is connected to a shutter element 120(SG). The shutter element 120 may transfer the charges accumulated in the photoelectric conversion element 110 into a first detection element 130. The shutter element 120 is connected to a transfer element 150 that transfers the charges of the first detection element 130 into a second detection element 140.

The first detection element 130 may be used as a charge storage region and may receive the charges accumulated in the photoelectric conversion element 110. A charge storage capacity of the first detection element 130 may be greater than that of the photoelectric conversion element 110. The charges generated and accumulated in the photoelectric conversion element 110 may be transferred into the first detection element 130 at once.

The charges accumulated in the first detection element 130 may be transferred into the second detection element 140 through the transfer element 150 (TG). The second detection element 140 may be a floating diffusion region (FD). The second detection element 140 may store charges cumulatively. A charge storage capacity of the second detection element 140 may be greater than that of the first detection element 130. The charges stored in the first detection element 130 may be transferred to the second detection element 140 at once. Since the charges generated in the photoelectric conversion element 110 are transferred to the second detection element 140 through the first detection element 130 at once, it is possible to solve an image distortion problem that may be caused by the transfer delay of charges when the charges are sequentially transferred. The second detection element 140 may be electrically connected to the amplification element 170 to control the amplification element 170.

The reset element 160 may reset the second detection element 140 by periods. A source of the reset element 160 may be connected to the second detection element 140, and a drain of the reset element 160 may be connected to a power voltage VDD. The reset element 160 may be driven by a bias provided through a reset signal line RX(i). If the reset element 160 is turned-on by the bias provided through the reset signal line RX(i), the power voltage VDD connected to the drain of the reset element 160 may be transmitted to the second detection element 140. As a result, the second detection element 140 may be reset when the reset element 160 is turned-on.

The amplification element 170 may be combined with a constant current source (not shown) located outside the unit pixel P to act as a source follower buffer amplifier. The amplification element 170 may amplify a variation of an electrical potential of the second detection element 140 to output the amplified potential variation to an output line.

Even though not shown in the drawings, an active contact (not shown) may be disposed between the reset element 160 and the amplification element 170. The active contact may apply a voltage to the unit pixel P.

The selection element 180 may select a unit cell to be sensed. In some embodiments, signals of all the pixels of one row may be sensed at the same time. The selection element 180 may be driven by a bias provided through a row selection line SEL(i). If the selection element 180 is turned-on, the power voltage VDD connected to a drain of the amplification element 170 may be transmitted to a drain of the selection element 180.

Driving signal lines TX(i), TX(ii), RX(i), and SEL(i) of the shutter element 120, the transfer element 150, the reset element 160, and the selection element 180 may extend in a row direction (e.g., a horizontal direction) to drive the unit pixels included in the same row at the same time.

Figure 2:
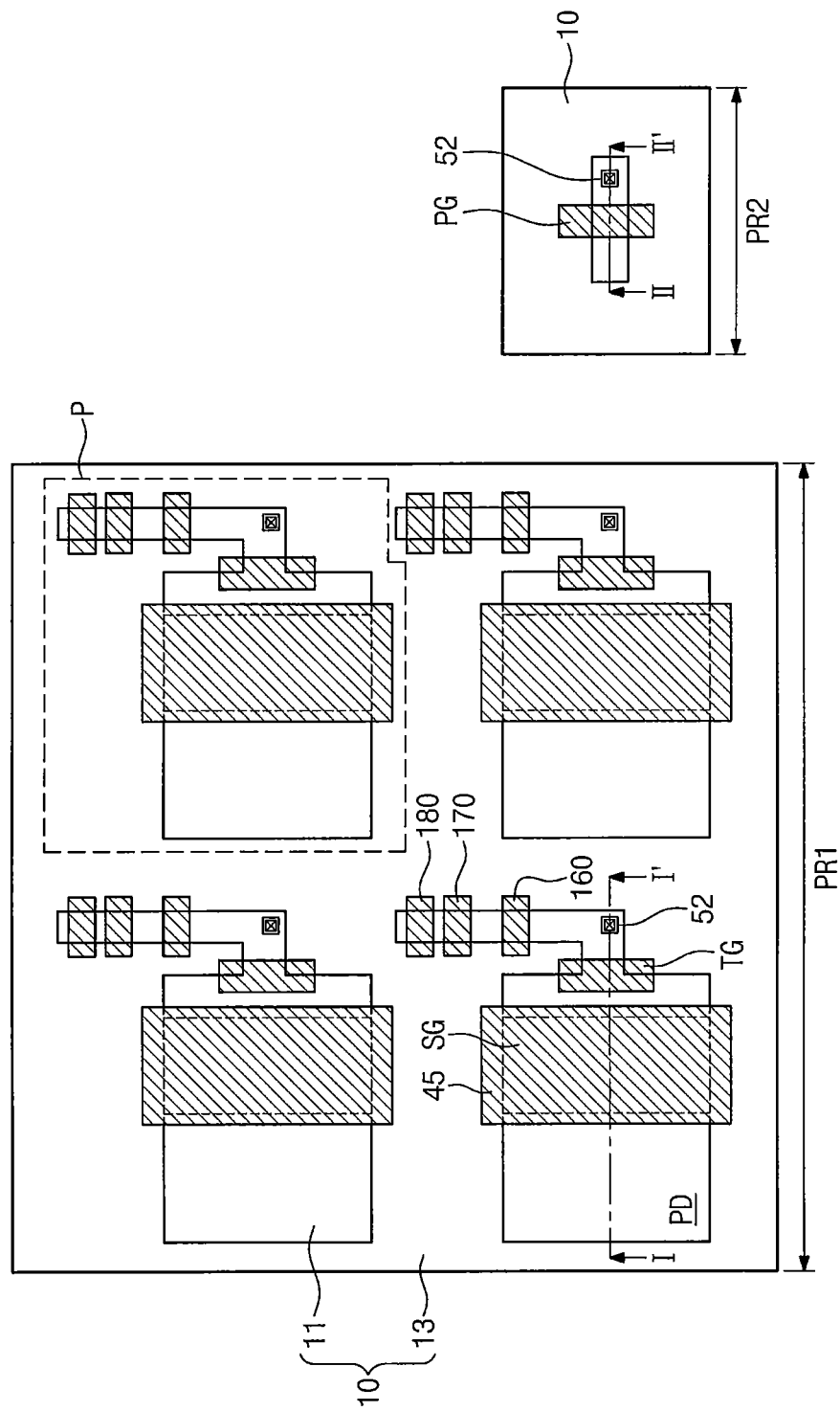
FIG. 2 is a plan view illustrating an image sensor according to some embodiments of the inventive concepts.
Figure 3A:
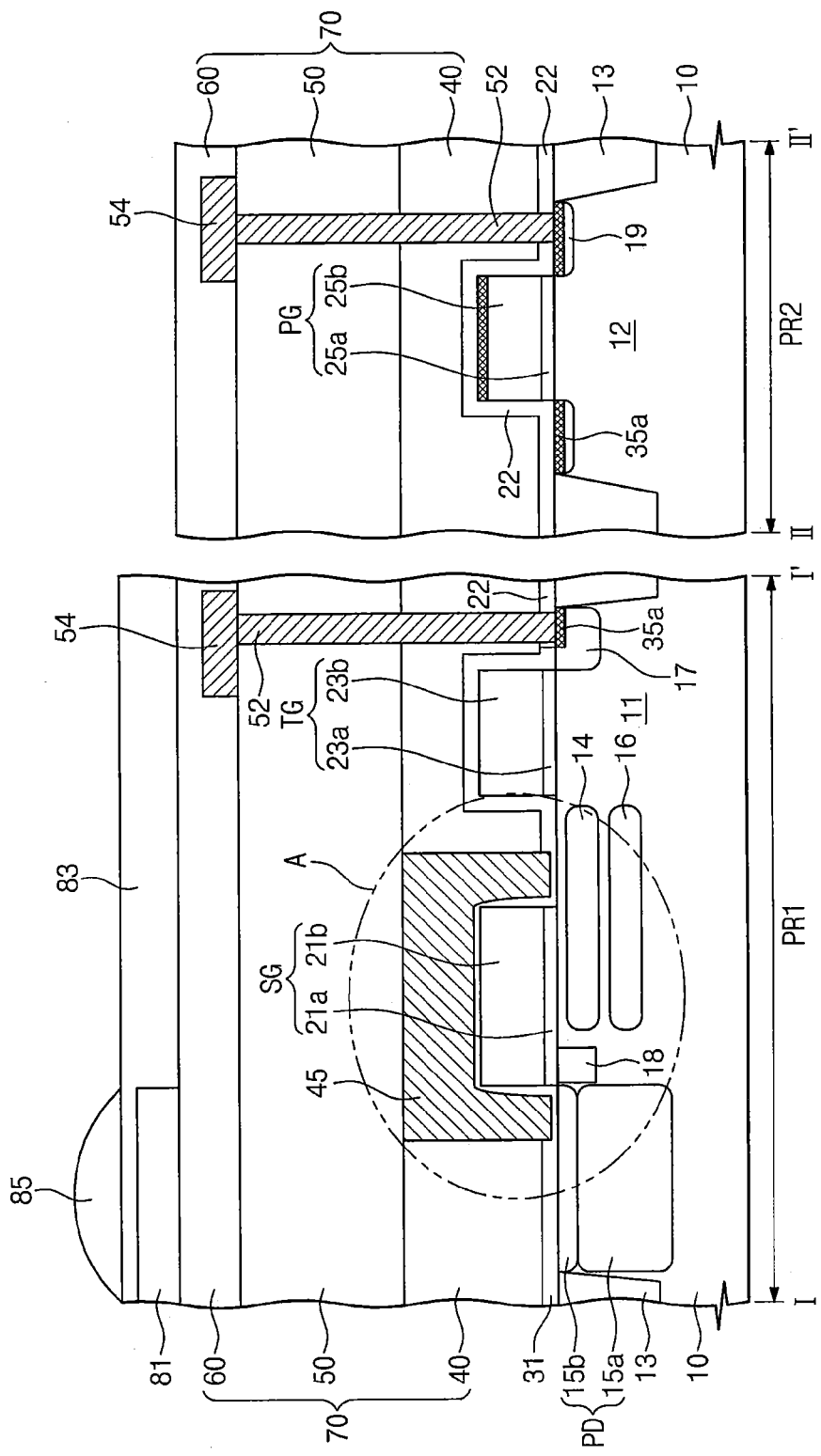
FIG. 3A is a cross-sectional view taken along lines I-I' and II-II' of FIG. 2 to illustrate an image sensor according to a first embodiment of the inventive concepts.
Figure 3B:
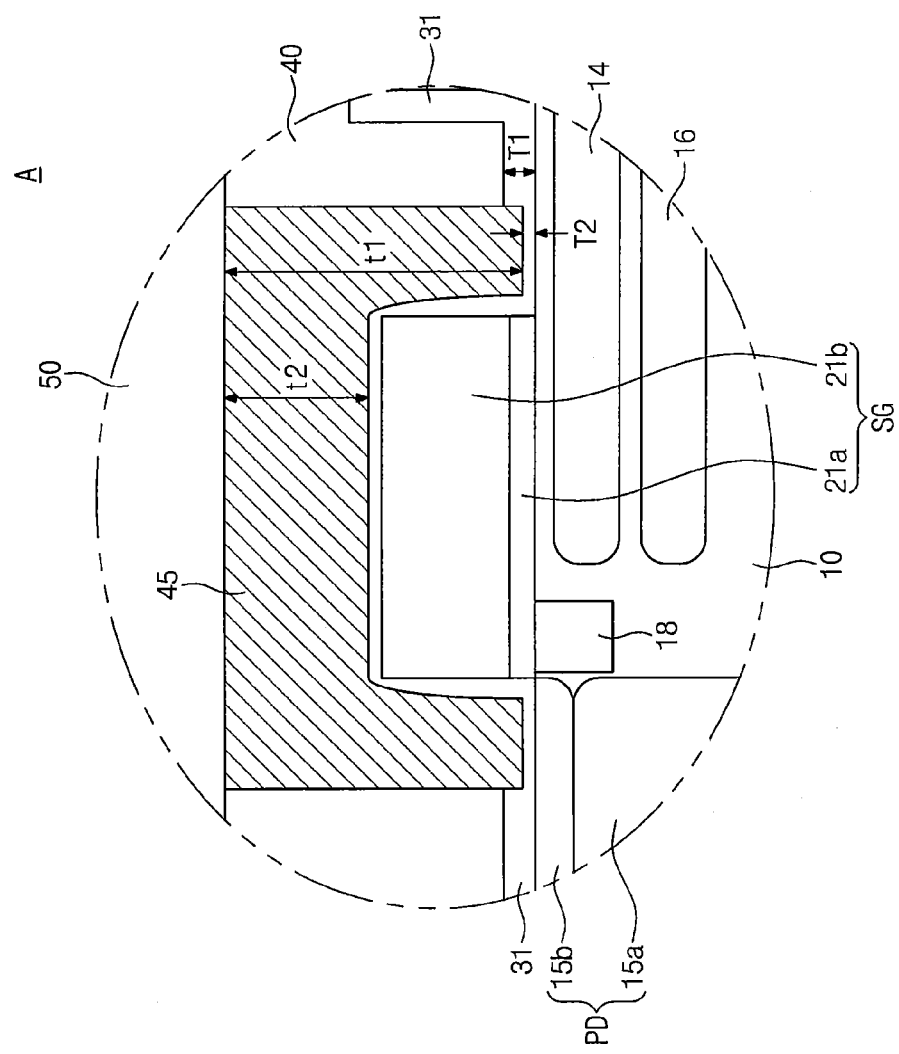
FIG. 3B is an enlarged view of a portion 'A' of FIG. 3A.

FIG. 2 is a plan view illustrating an image sensor according to some embodiments of the inventive concepts. FIG. 3A is a cross-sectional view taken along lines I-I' and II-II' of FIG. 2 to illustrate an image sensor according to a first embodiment of the inventive concepts. FIG. 3B is an enlarged view of a portion 'A' of FIG. 3A.

Referring to FIGS. 2 and 3A, a semiconductor substrate 10 may include a pixel region PR1 and a peripheral circuit region PR2. For example, the semiconductor substrate 10 may be a P-type semiconductor substrate. A device isolation layer 13 may be disposed in the semiconductor substrate 10. The device isolation layer 13 disposed in the pixel region PR1 may define first active regions 11 for unit pixels P. The first active regions 11 may correspond to portions of the semiconductor substrate 10 that are surrounded by the device isolation layer 13.

A photoelectric conversion element PD may be disposed in the semiconductor substrate 10 (e.g., each of the first active regions 11) of the pixel region PR1. In some embodiments, the photoelectric conversion element PD may be a photo diode. The photoelectric conversion element PD may include a first dopant region 15a and a second dopant region 15b. The first dopant region 15a may be formed deep from a top surface of the semiconductor substrate 10. The second dopant region 15b may be formed shallow from the top surface of the semiconductor substrate 10. The first and second dopant regions 15a and 15b may have conductivity types different from each other. For example, the first dopant region 15a may be doped with N-type dopants, and the second dopant region 15b may be doped with P-type dopants.

A charge storage region 14 may be disposed in the semiconductor substrate 10 (e.g., each of the first active regions 11) of the pixel region PR1. The charge storage region 14 may be spaced part from the photoelectric conversion element PD. The charge storage region 14 may be formed close to the top surface of the semiconductor substrate 10. The charge storage region 14 may be doped with N-type dopants. A well region 16 may be disposed under the charge storage region 14. The well region 16 may be doped with P-type dopants. A separation region 18 may be disposed between the photoelectric conversion element PD and the charge storage region 14. The separation region 18 may be doped with P-type dopants.

A floating diffusion region 17 may be disposed in the semiconductor substrate 10 (e.g., each of the first active regions 11) of the pixel region PR1. The floating diffusion region 17 may be spaced apart from the charge storage region 14. The floating diffusion region 17 may be doped with, for example, N-type dopants. The floating diffusion region 17 may consist of one doped region, and an area of the floating diffusion region 17 may be smaller than that of the photoelectric conversion element PD.

A shutter gate SG may be disposed on the substrate 10 (e.g., each of the first active regions 11) of the pixel region PR1. The shutter gate SG may be disposed on the charge storage region 14 and may be adjacent the second dopant region 15b. The shutter gate SG may include a shutter gate insulating layer 21a and a shutter gate electrode 21b.

A transfer gate TG may be disposed on the semiconductor substrate 10 (e.g., each of the first active regions 11) of the pixel region PR1. The transfer gate TG may be laterally spaced apart from the shutter gate SG. The transfer gate TG may be adjacent the floating diffusion region 17 and may be disposed on the semiconductor substrate 10 between the charge storage region 14 and the floating diffusion region 17. The transfer gate TG may include a transfer gate insulating layer 23a and a transfer gate electrode 23b.

Third dopant regions 19 may be disposed in the semiconductor substrate 10 of the peripheral circuit region PR2. The third dopant regions 19 may be disposed in a second active region 12 that is defined by the device isolation layer 13 of the peripheral circuit region PR2. The third dopant regions 19 may be source/drain regions or a well region.

A peripheral circuit gate PG may be disposed on the semiconductor substrate 10 of the peripheral circuit region PR2. In some embodiments, the peripheral circuit gate PG may be disposed on the second active region 12 between the third dopant regions 19. The peripheral circuit gate PG may include a peripheral circuit gate insulating layer 25a and a peripheral circuit gate electrode 25b.

A silicide layer 35a may be formed on each of a surface of the peripheral circuit gate electrode 25b, the floating diffusion region 17, and the third dopant regions 19. The silicide layer 35a may be used as an ohmic layer for reducing an electrical resistance between the semiconductor substrate 10 formed of silicon and via-contacts 52 formed of a metal material.

A dielectric layer 31 may be formed on the semiconductor substrate 10 of the pixel region PR1. The dielectric layer 31 may cover the top surface of the semiconductor substrate 10, a top surface and a sidewall of the shutter gate SG, and a top surface and a sidewall of the transfer gate TG. The dielectric layer 31 may expose a portion of the floating diffusion region 17. A light shielding layer 45 may be disposed on the dielectric layer 31 to cover the shutter gate SG. In more detail, the light shielding layer 45 may cover the top surface and the sidewall of the shutter gate SG. The light shielding layer 45 may include a first portion covering sidewalls of the shutter gate SG and a second portion disposed on the top surface of the shutter gate SG. A top surface of the dielectric layer 31, which is in contact with a bottom surface of the first portion of the light shielding layer 45, may be recessed. The bottom surface of the first portion of the light shielding layer 45 may be lower than a top surface of the dielectric layer 31 covering the top surface of the semiconductor substrate 10 disposed at a side of the light shielding layer 45. Thus, as illustrated in FIG. 3B, a first thickness T1 of the dielectric layer 31 disposed on the top surface of the semiconductor substrate 10 not covered by the light shielding layer 45 may be greater than a second thickness T2 of the dielectric layer 31 disposed under the bottom surface of the first portion of the light shielding layer 45.

A first thickness t1 of the first portion of the light shielding layer 45 may be greater than a second thickness t2 of the second portion of the light shielding layer 45. In more detail, the first thickness t1 of the first portion of the light shielding layer 45 corresponds to a vertical height from the top surface of the recessed dielectric layer 31 to a top surface of the first portion of the light shielding layer 45. The second thickness t2 of the second portion of the light shielding layer 45 corresponds to a vertical height from the top surface of the dielectric layer 31 formed on the top surface of the shutter gate electrode 21b to a top surface of the second portion of the light shielding layer 45. The dielectric layer 31 may include a silicon nitride (SiN) layer. The light shielding layer 45 may include a tungsten layer or an aluminum layer. The top surface of the first portion having the first thickness t1 of the light shielding layer 45 may be coplanar with the top surface of the second portion having the second thickness t2 of the light shielding layer 45. In other words, an entire top surface of the light shielding layer 45 may be flat.

While light is incident on the photoelectric conversion element PD, the light shielding layer 45 shields the charge storage region 14 from the light. If light is incident on the charge storage region 14, signal charges stored in the charge storage region 13 may be changed which may distort an image. The shutter gate SG may also shield the light, so the light provided toward the semiconductor substrate 10 disposed under the shutter gate SG may be shielded by the shutter gate SG and the light shielding layer 45. On the other hand, the light provided toward the semiconductor substrate 10 disposed at a side of the shutter gate SG may be shielded by the light shielding layer 45. Thus, a light shielding effect of the semiconductor substrate 10 disposed at a side of the shutter gate TG may be weaker than that of the semiconductor substrate 10 disposed under the shutter gate TG.

According to some embodiments of the inventive concepts, the first thickness t1 of the first portion of the light shielding layer 45 is greater than the second thickness t2 of the second portion of the light shielding layer 45, so the light shielding layer 45 may effectively shield the light provided toward the semiconductor substrate 10 under the first portion of the light shielding layer 45. Light reflected by the light shielding layer 45 may be provided to the photoelectric conversion element PD. As a result, an accurate image may be obtained without the distortion of an image.

As described above, the second thickness T2 of the dielectric layer 31 may be smaller than the first thickness T1 of the dielectric layer 31, and thus, it is possible to reduce or minimize scattered light that may be provided between the top surface of the semiconductor substrate 10 and the bottom surface of the first portion of the light shielding layer 45. In other words, it is possible to reduce or minimize the scattered light provided to the charge storage region 14.

Referring again to FIG. 3A, a protection dielectric layer 22 may be disposed on the semiconductor substrate 10 of the peripheral circuit region PR1. The protection dielectric layer 22 may cover the peripheral circuit gate PG, the silicide layer 35a on the peripheral circuit gate electrode 25b, and the silicide layers 35a on the third dopant regions 19. In addition, the protection dielectric layer 22 may extend into the pixel region PR1 so as to cover the silicide layer 35a disposed on the floating diffusion region 17.

An interlayer insulating structure 70 may be disposed on the semiconductor substrate 10. The interlayer insulating structure 70 may include a first interlayer insulating layer 40, a second interlayer insulating layer 50, and a third interlayer insulating layer 60. The first interlayer insulating layer 40 may cover the shutter gate SG, the transfer gate TG, and the peripheral circuit gate PG on the semiconductor substrate 10. The first interlayer insulating layer 40 may expose the top surface of the light shielding layer 45. The second interlayer insulating layer 50 may be disposed on the first interlayer insulating layer 40. The via-contacts 52 may penetrate the second and first interlayer insulating layers 40 and 50. The via-contact 52 disposed in the pixel region PR1 may be in contact with the silicide layer 35a formed on the floating diffusion region 17. The via-contact 52 disposed in the peripheral circuit region PR2 may be in contact with the silicide layer 35a formed on the third dopant region 19. Interconnections 54 may be disposed on the second interlayer insulating layer 50. The interconnections 54 may be in contact with the via-contacts 52, respectively. The third interlayer insulating layer 60 may be disposed on the second interlayer insulating layer 50 to cover the interconnections 54.

A color filter 81 may be disposed on the third interlayer insulating layer 60 of the pixel region PR1. The color filter 81 may overlap with the photoelectric conversion element PD. A planarization layer 83 covering the color filter 81 may be disposed on the third interlayer insulating layer 60. The planarization layer 83 may include a plurality of refractive layers. A micro-lens 85 may be disposed on the planarization layer 83. The micro-lens 84 may overlap with the color filter 81.

Figure 4A:
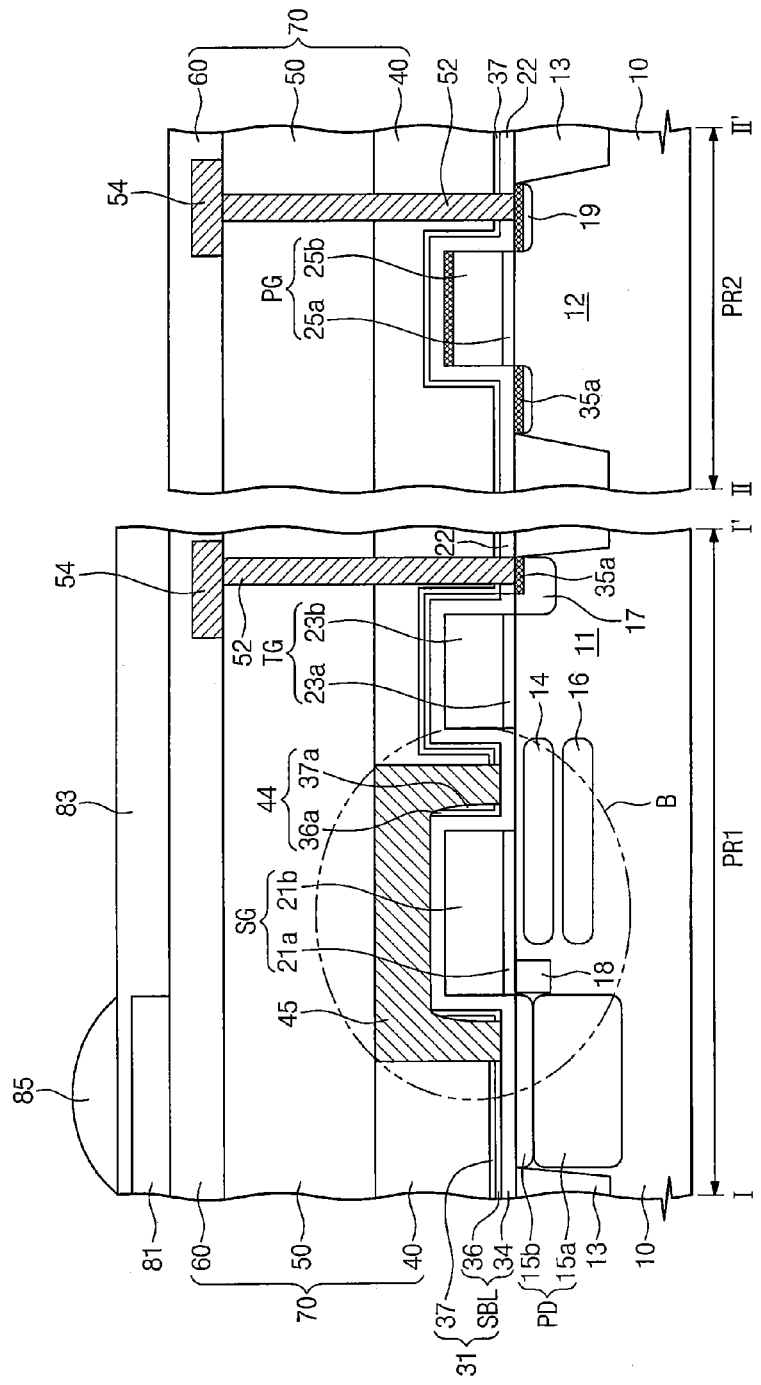
FIG. 4A is a cross-sectional view taken along lines I-I' and II-II' of FIG. 2 to illustrate an image sensor according to a second embodiment of the inventive concepts.
Figure 4B:
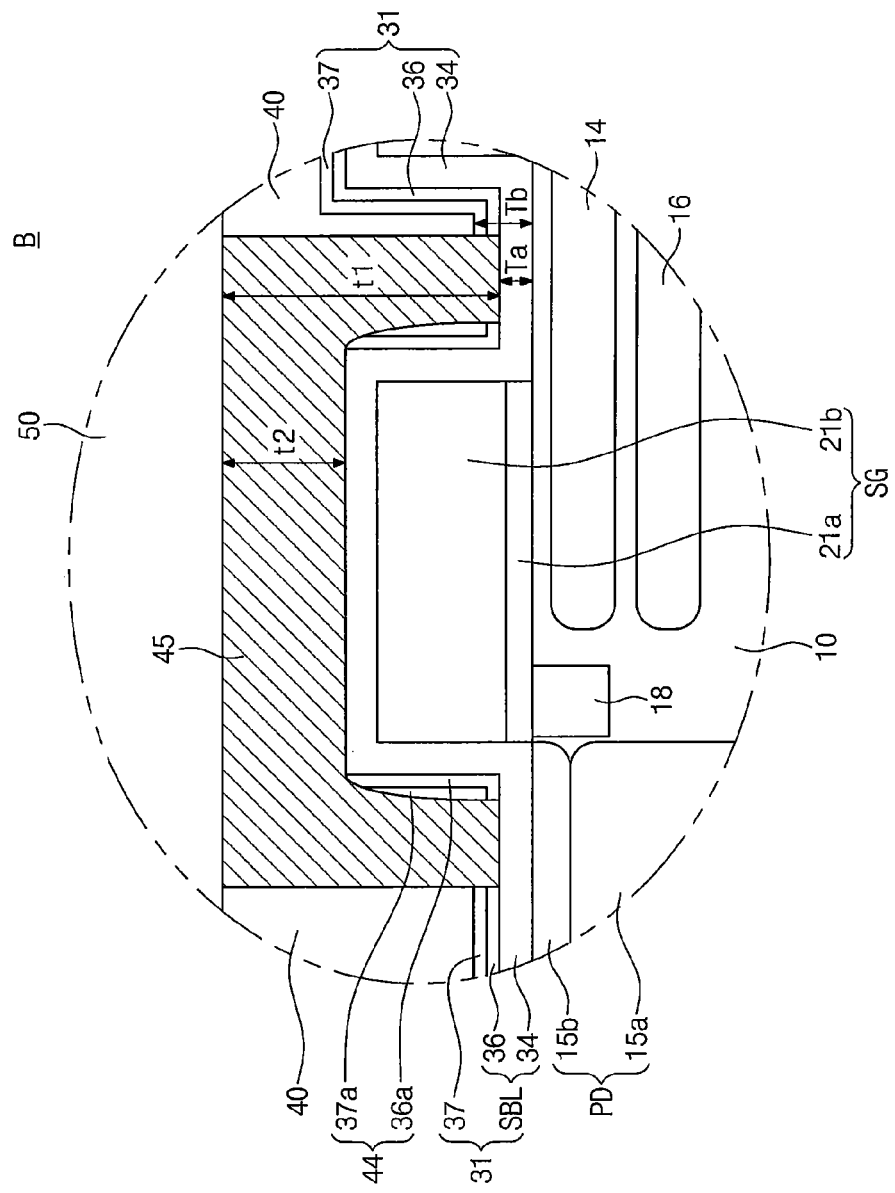
FIG. 4B is an enlarged view of a portion 'B' of FIG. 4A.

FIG. 4A is a cross-sectional view taken along lines I-I' and II-II' of FIG. 2 to illustrate an image sensor according to a second embodiment of the inventive concepts. FIG. 4B is an enlarged view of a portion 'B' of FIG. 4A. In the present embodiment, the same elements as described in the first embodiment will be indicated by the same reference numerals or the same reference designators. The descriptions to the same elements as in the first embodiment will be omitted or mentioned briefly for the purpose of ease and convenience in explanation.

Referring to FIG. 4A, a first dielectric layer 34 may be formed on the semiconductor substrate 10 of the pixel region PR1. The first dielectric layer 34 may conformally cover the top surface of the semiconductor substrate 10, and the top surface and the sidewall of the shutter gate SG, and the top surface and the sidewall of the transfer gate TG. Spacers 44 may be disposed on the sidewalls of the shutter gate SG with the first dielectric layer 34 interposed therebetween. The spacer 44 may include a second dielectric pattern 36a and a third dielectric pattern 37a that are sequentially stacked on the first dielectric layer 34. A second dielectric layer 36 and a third dielectric layer 37 may be sequentially stacked on the first dielectric layer 34 exposed by the light shielding layer 45. The second dielectric layer 36 and the third dielectric layer 37 may constitute a silicide blocking layer SBL. A dielectric layer 31 may include the first, second, and third dielectric layers 34, 36, and 37. The second dielectric pattern 36a may include the same material as the second dielectric layer 36. The third dielectric pattern 37a may include the same material as the third dielectric layer 37. The first dielectric layer 34 may include a silicon nitride (SiN) layer. The second dielectric layer 36 may include a silicon oxide ($SiO_2$) layer, and the third dielectric layer 37 may include a silicon oxynitride (SiON) layer.

Referring to FIGS. 4A and 4B, the light shielding layer 45 may cover the first dielectric layer 34 and the second spacer 44 on the shutter gate SG. A first thickness Ta of the first dielectric layer 34 disposed between the top surface of the semiconductor substrate 10 and the bottom surface of the first portion of the light shielding layer 45 may be smaller than a second thickness Tb of the dielectric layer 31 disposed on the top surface of the semiconductor substrate 10 not covered by the light shielding layer 45. Some embodiments provide that the second thickness Tb of the dielectric layer 31 corresponds to a sum of thicknesses of the first, second, and third dielectric layers 34, 36, and 37.

The first thickness t1 of the first portion, covering the sidewalls of the shutter gate SG, of the light shielding layer 45 may be greater than the second thickness t2 of the second portion, disposed on the top surface of the shutter gate SG, of the light shielding layer 45. The first thickness t1 of the first portion of the light shielding layer 45 corresponds to a vertical height from the top surface of the first dielectric layer 34 disposed under the light shielding layer 45 to the top surface of the first portion of the light shielding layer 45. The second thickness t2 of the second portion of the light shielding layer 45 corresponds to a vertical height from the top surface of the first dielectric layer 34 formed on the top surface of the shutter gate electrode 21b to the top surface of the second portion of the light shielding layer 45. The top surface of the first dielectric layer 34 may be coplanar with the bottom surface of the light shielding layer 45.

Referring again to FIG. 4A, the third dielectric layer 37 may be conformally formed on the semiconductor substrate 10 of the peripheral circuit region PR2. The third dielectric layer 37 may be formed on the protection dielectric layer 22. The third dielectric layer 37 may cover the top surface and the sidewall of the peripheral circuit gate PG.

The interlayer insulating structure 70 including the first to third interlayer insulating layers 40, 50, and 60 may be disposed on the semiconductor substrate 10. The via-contacts 52 may penetrate the second and first interlayer insulating layers 50 and 40 so as to be electrically connected to the silicide layers 35a. The via-contacts 52 may be electrically connected to the interconnections 54 disposed on the second interlayer insulating layer 50. The planarization layer 83, the color filter 81, and the micro-lens 85 may be disposed on the interlayer insulating structure 70 of the pixel region PR1.

Figure 5A:
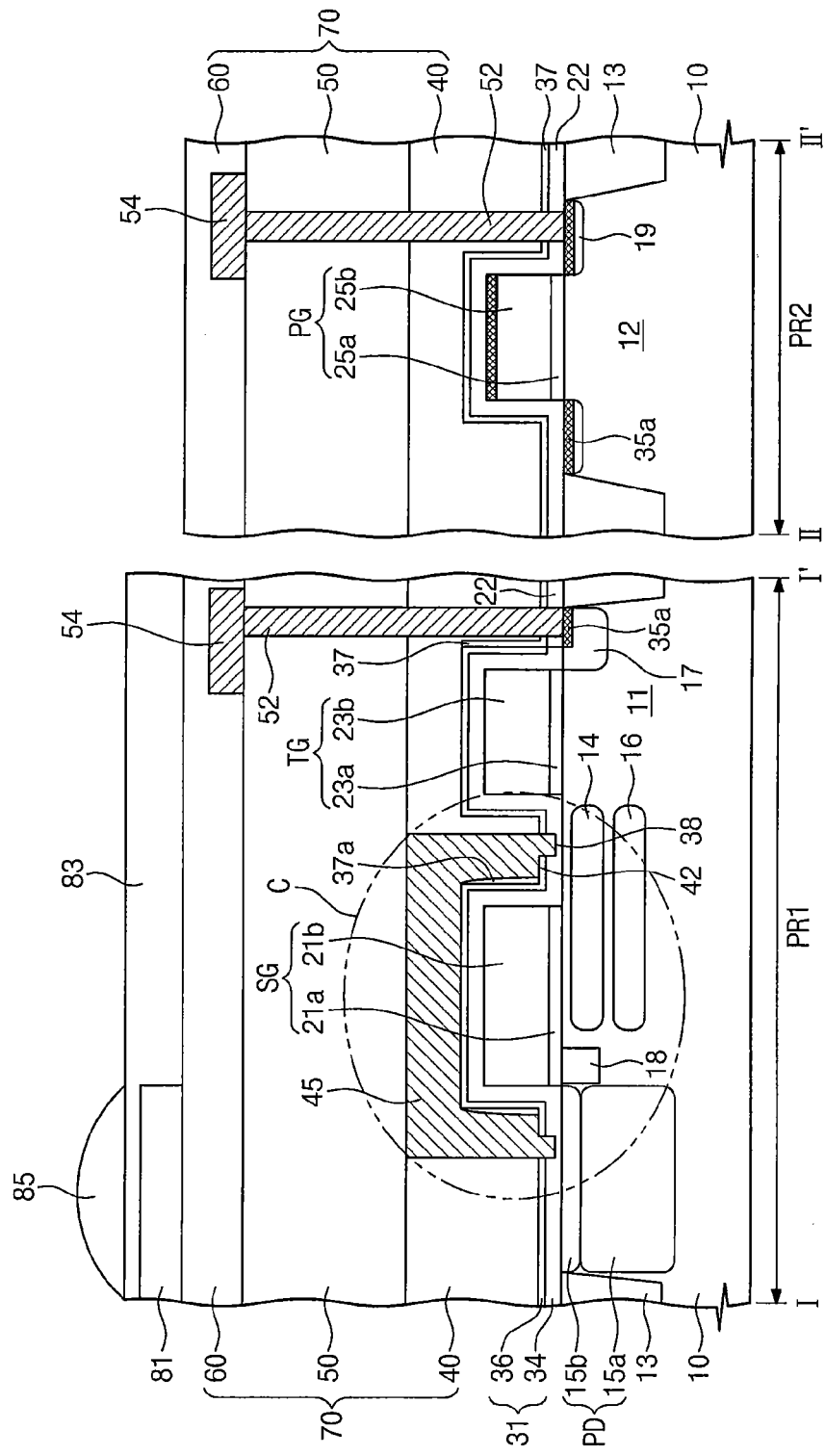
FIG. 5A is a cross-sectional view taken along lines I-I' and II-II' of FIG. 2 to illustrate an image sensor according to a third embodiment of the inventive concepts.
Figure 5B:
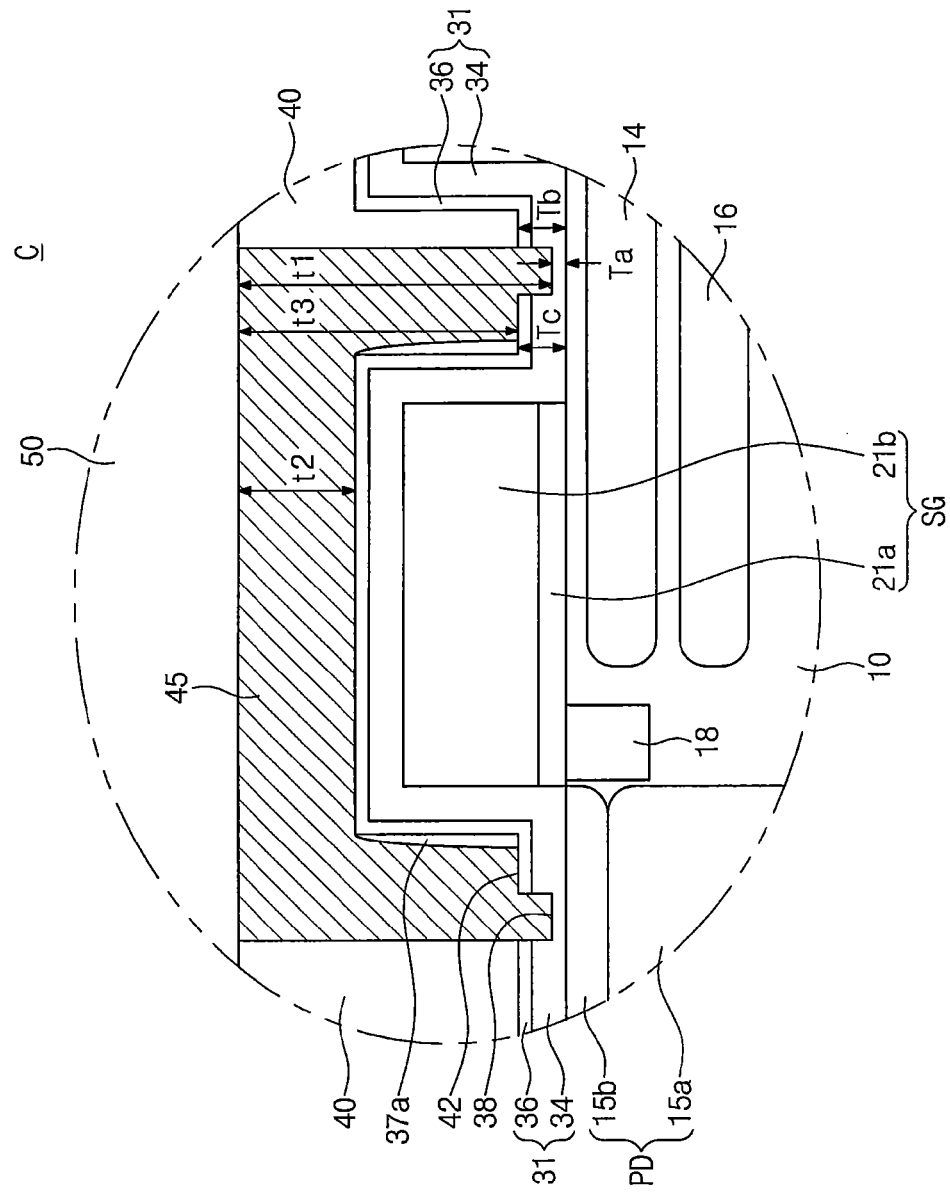
FIG. 5B is an enlarged view of a portion 'C' of FIG. 5A.

FIG. 5A is a cross-sectional view taken along lines I-I' and II-II' of FIG. 2 to illustrate an image sensor according to a third embodiment of the inventive concepts. FIG. 5B is an enlarged view of a portion 'C' of FIG. 5A. In the present embodiment, the same elements as described in the first and second embodiments will be indicated by the same reference numerals or the same reference designators. The descriptions to the same elements as in the first and second embodiments will be omitted or mentioned briefly for the purpose of ease and convenience in explanation.

Referring to FIG. 5A, the first dielectric layer 34 may conformally cover the top surface of the semiconductor substrate 10, the top surface and the sidewall of the shutter gate SG and the top surface and the sidewall of the transfer gate TG. The second dielectric layer 36 may be conformally formed on the first dielectric layer 34. The third dielectric pattern 37a may be disposed on the sidewall of the shutter gate SG with the first and second dielectric layers 34 and 36 interposed therebetween. The third dielectric layer 37 may be formed to cover the floating diffusion region 17.

The light shielding layer 45 may cover the shutter gate SG and the third dielectric pattern 37a on the second dielectric layer 36. Each of bottom surfaces, which are disposed at both sides of the shutter gate SG, respectively, of the first portion of the light shielding layer 45 may include a first bottom surface 38 and a second bottom surface 42. Here, the first bottom surface 38 may be lower than the top surface of the first dielectric layer 34 and higher than the top surface of the semiconductor substrate 10. The second bottom surface 42 may be disposed between the first bottom surface 38 and the third dielectric pattern 37a when viewed from a plan view. The second bottom surface 42 may be higher than the first bottom surface 38 and may be coplanar with the top surface of the second dielectric layer 36.

Referring to FIGS. 5A and 5B, a first thickness t1 of the light shielding layer 45 from the first bottom surface 38 to the top surface of the first portion of the light shielding layer 45 may be greater than the second thickness t2 of the second portion, covering the top surface of the shutter gate electrode 21b, of the light shielding layer 45. A third thickness t3 of the light shielding layer 45 from the second bottom surface 42 to the top surface of the first portion of the light shielding layer 45 may be smaller than the first thickness t1 and greater than the second thickness t2.

A dielectric layer 31 according to some embodiments may consist of the first and second dielectric layers 34 and 36. A first thickness Ta of the first dielectric layer 34 between the top surface of the semiconductor substrate 10 and the first bottom surface 38 may be smaller than a second thickness Tb of the dielectric layer 31 not covered by the light shielding layer 45. The second thickness Tb of the dielectric layer 31 may be a sum of thicknesses of the first and second dielectric layers 34 and 36. The dielectric layer 31 may have a third thickness Tc between the top surface of the semiconductor substrate 10 and the second bottom surface 42. The third thickness Tc of the dielectric layer 31 may be equal to the second thickness Tb of the dielectric layer 31.

Figure 6A:
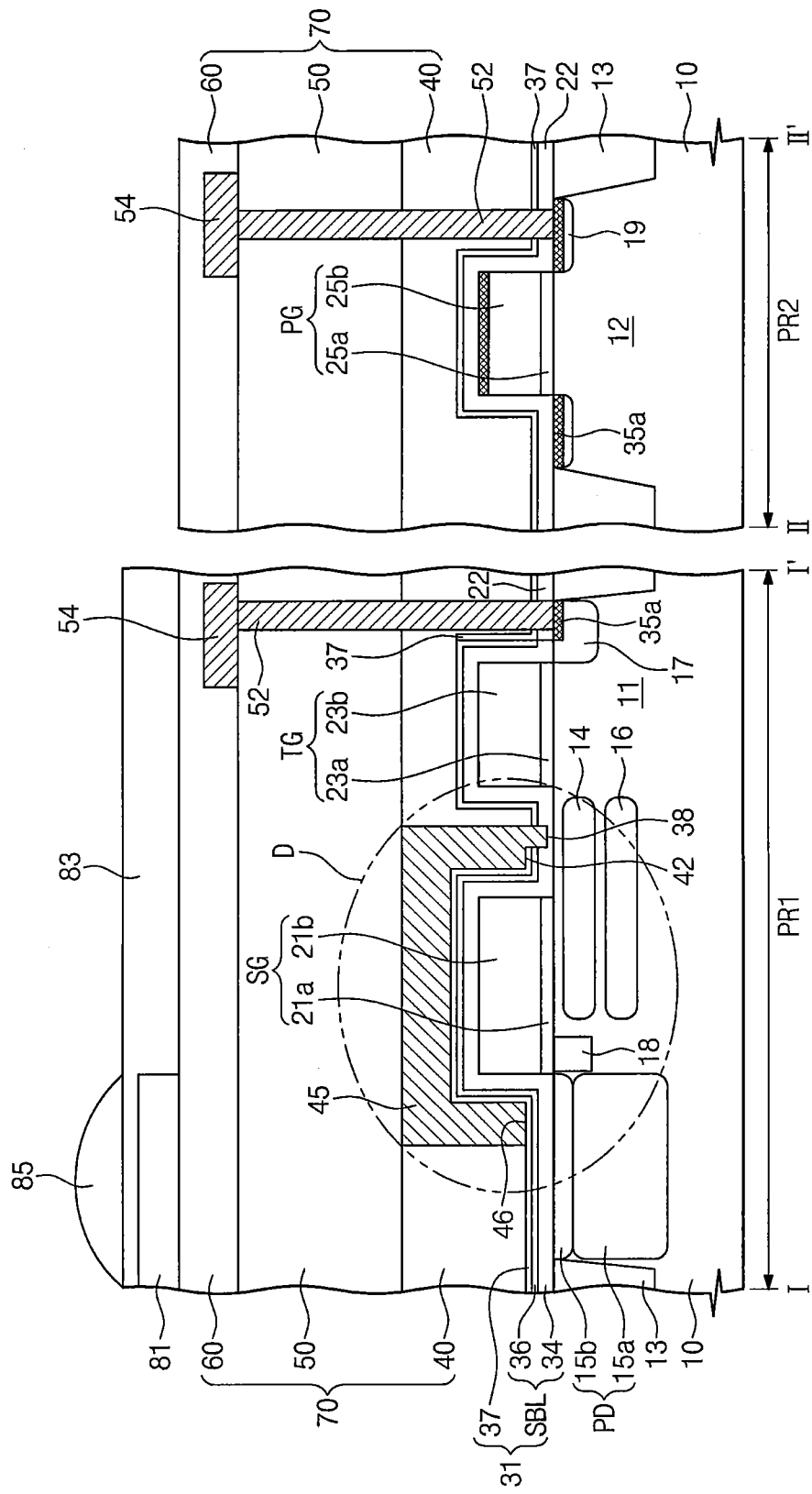
FIG. 6A is a cross-sectional view taken along lines I-I' and II-II' of FIG. 2 to illustrate an image sensor according to a fourth embodiment of the inventive concepts.
Figure 6B:
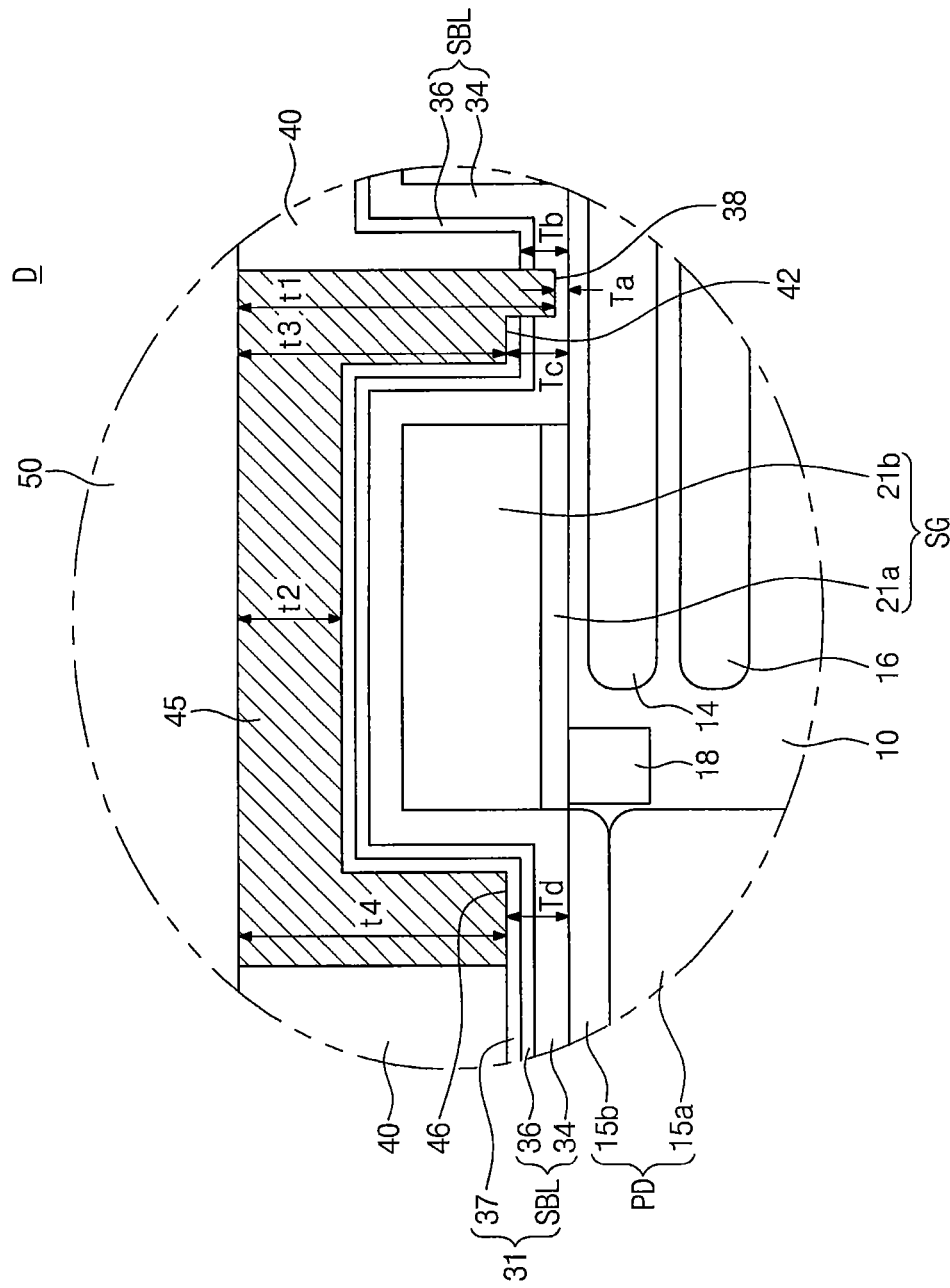
FIG. 6B is an enlarged view of a portion 'D' of FIG. 6A.

FIG. 6A is a cross-sectional view taken along lines I-I' and II-II' of FIG. 2 to illustrate an image sensor according to a fourth embodiment of the inventive concepts, and FIG. 6B is an enlarged view of a portion 'D' of FIG. 6A. In the present embodiment, the same elements as described in the first to third embodiments will be indicated by the same reference numerals or the same reference designators. The descriptions to the same elements as in the first to third embodiments will be omitted or mentioned briefly for the purpose of ease and convenience in explanation.

Referring to FIG. 6A, a first dielectric layer 34 and a second dielectric layer 36, which cover the shutter and transfer gates SG and TG may be sequentially formed on the semiconductor substrate 10 of the pixel region PR1. The first and second dielectric layers 34 and 36 may expose the floating diffusion region 17. A third dielectric layer 37 may be disposed between the light shielding layer 45 and the second dielectric layer 36. The third dielectric layer 37 may extend onto the top surface of the second dielectric layer 36 covering the photoelectric conversion element PD. In addition, the third dielectric layer 37 may further extend onto the protection dielectric layer 22 covering the floating diffusion region 17.

The third dielectric layer 37 covering the shutter gate SG may be disposed on the second dielectric layer 36. The first bottom surface 38, which is disposed at a first side of the shutter gate SG, of the first portion of the light shielding layer 45 may be lower than the top surface of the first dielectric layer 34 and higher than the top surface of the semiconductor substrate 10. A second bottom surface 42, which is disposed at the first side of the shutter gate SG, of the first portion of the light shielding layer 45 may be coplanar with the top surface of the third dielectric layer 37. A third bottom surface 46, which is disposed at a second side of the shutter gate SG, of the first portion of the light shielding layer 45 may be coplanar with the top surface of the third dielectric layer 37.

Referring to FIGS. 6A and 6B, the first thickness t1 of the light shielding layer 45 from the first bottom surface 38 to the top surface of the first portion may be greater than the second thickness t2 of the second portion of the light shielding layer 45. A third thickness t3 of the light shielding layer 45 from the second bottom surface 42 to the top surface of the second portion may be smaller than the first thickness t1 and greater than the second thickness t2. A fourth thickness t4 of the light shielding layer 45 from the third bottom surface 46 to the top surface of the first portion of the light shielding layer 45 may be smaller than the first thickness t1 and greater than the second thickness t2. The fourth thickness t4 may be equal to the third thickness t3.

A first thickness Ta of the first dielectric layer 34 between the top surface of the semiconductor substrate 10 and the first bottom surface 38 of the light shielding layer 45 may be smaller than a second thickness Tb of the dielectric layer 31 that is covered by the light shielding layer 45 and is adjacent the transfer gate TG. The second thickness Tb of the dielectric layer 31 may be smaller than a third thickness Tc of the dielectric layer 31 between the top surface of the semiconductor substrate 10 and the second bottom surface 42 of the light shielding layer 45. A fourth thickness of the dielectric layer 31 between the top surface of the semiconductor substrate 10 and the third bottom surface 46 of the light shielding layer 45 may be equal to the third thickness Tc of the dielectric layer 31. The second thickness Tb of the dielectric layer 31 may be a sum of thicknesses of the first and second dielectric layers 34 and 36. Each of the third and fourth thicknesses Tc and Td may be a sum of thicknesses of the first to third dielectric layers 34, 36, and 37.

Figure 7:
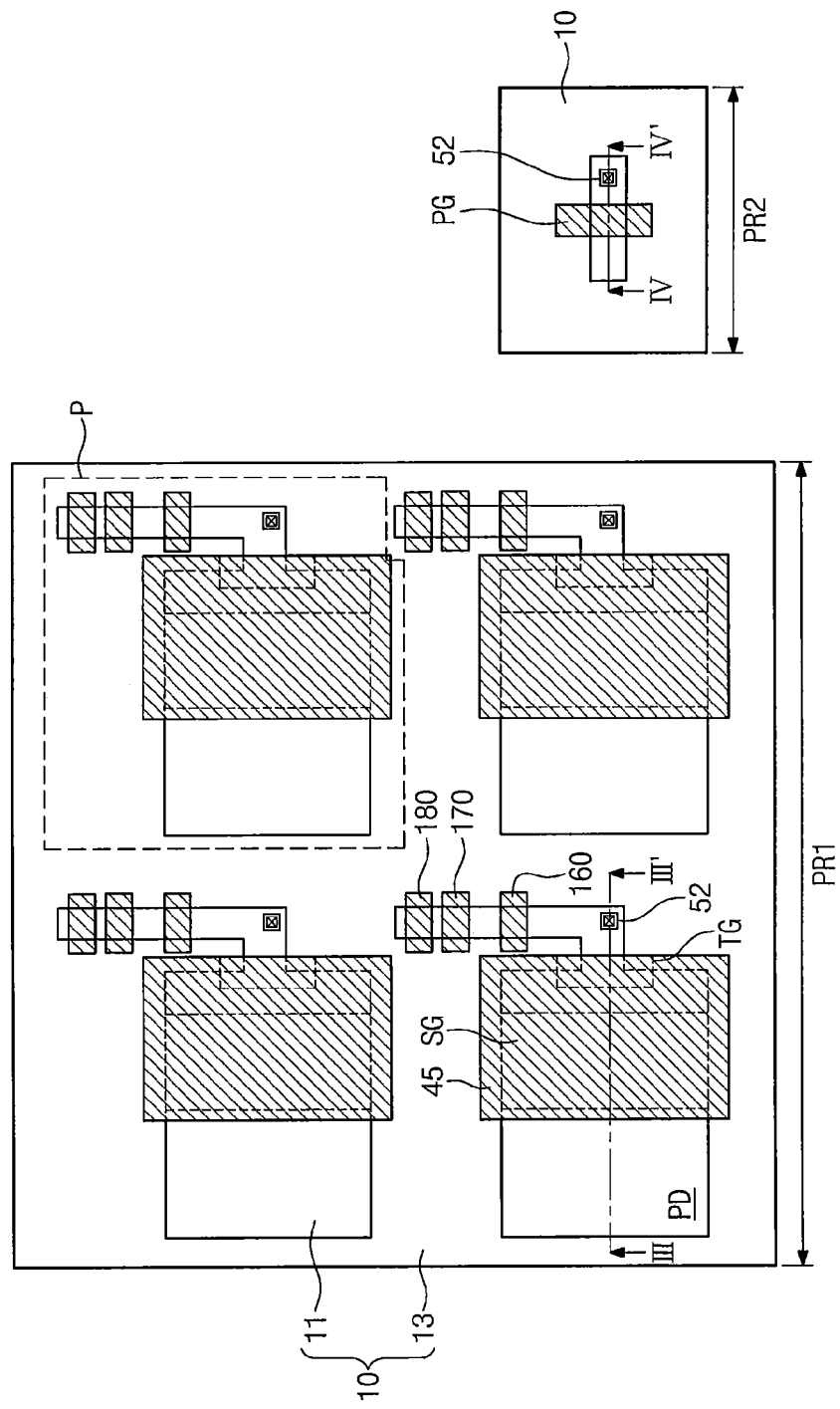
FIG. 7 is a plan view illustrating an image sensor according to a fifth embodiment of the inventive concepts.
Figure 8:
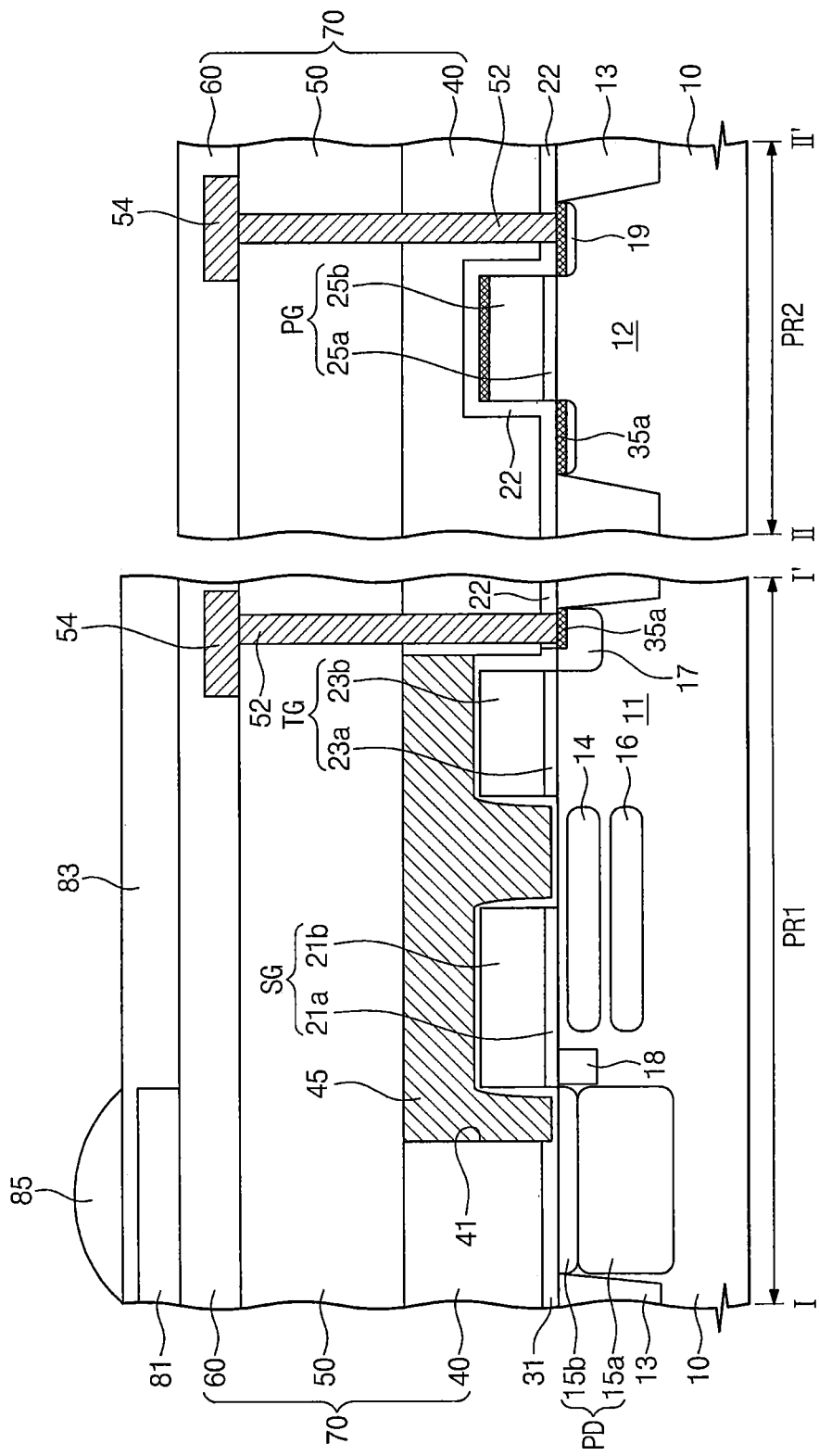
FIG. 8 is a cross-sectional view taken along lines III-III' and VI-VI' of FIG. 7 to illustrate the image sensor according to the fifth embodiment of the inventive concepts.

FIG. 7 is a plan view illustrating an image sensor according to a fifth embodiment of the inventive concepts. FIG. 8 is a cross-sectional view taken along lines III-III' and VI-VI' of FIG. 7 to illustrate the image sensor according to the fifth embodiment of the inventive concepts. In the present embodiment, the same elements as described in the first embodiment will be indicated by the same reference numerals or the same reference designators. The descriptions to the same elements as in the first embodiment will be omitted or mentioned briefly for the purpose of ease and convenience in explanation.

Referring to FIGS. 7 and 8, a light shielding layer 45 may be formed to cover both the shutter gate SG and the transfer gate TG. In more detail, the light shielding layer 45 may cover the top surface and the sidewalls of the shutter gate SG and a top surface and at least one sidewall of the transfer gate TG. In some embodiments, the light shielding layer 45 may cover one sidewall of the transfer gate TG which is adjacent the shutter gate SG. A space between the shutter gate SG and the transfer gate TG may be completely filled with the light shielding layer 45. The dielectric layer 31 being in contact with the light shielding layer 45 may be thinner than the dielectric layer 31 that is exposed by the light shielding layer 45 and is in contact with a bottom surface of the first interlayer insulating layer 40.

FIGS. 9A to 9I are cross-sectional views taken along lines I-I' and II-II' of FIG. 2 to illustrate a method of fabricating the image sensor according to the first embodiment of the inventive concepts.

Figure 9A:
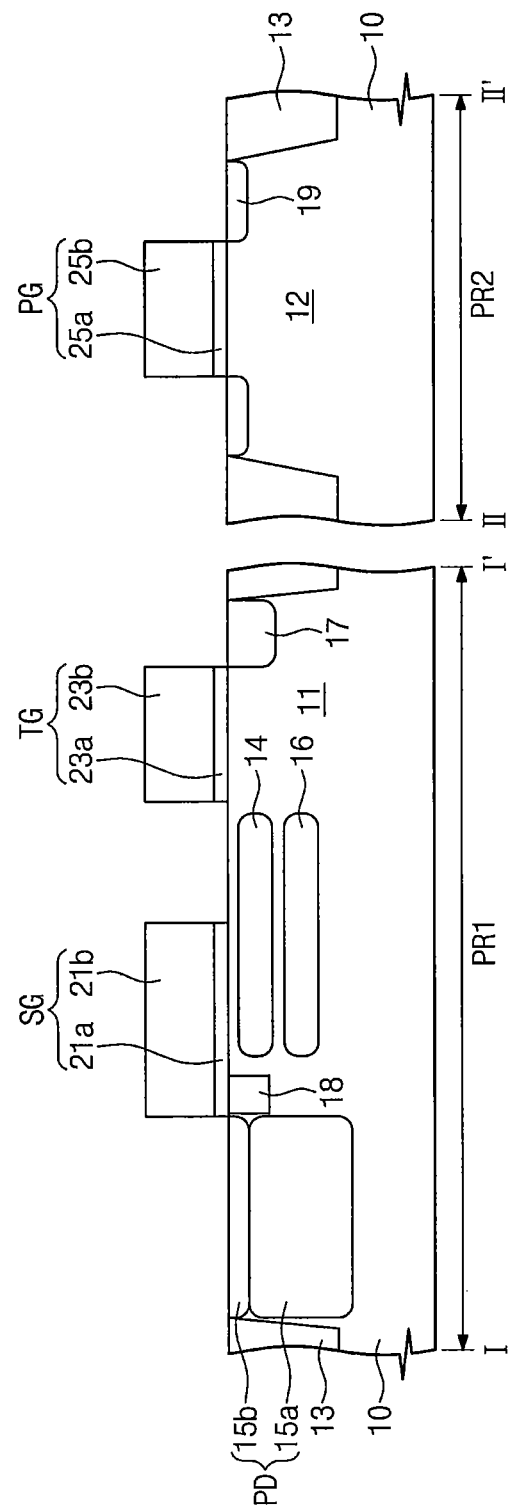
FIGS. 9A to 9I are cross-sectional views taken along lines I-I' and II-II' of FIG. 2 to illustrate a method of fabricating the image sensor according to the first embodiment of the inventive concepts.

Referring to FIG. 9A, a semiconductor substrate 10 may include a pixel region PR1 and a peripheral circuit region PR2. The semiconductor substrate 10 may be doped with P-type dopants. A device isolation layer 13 may be formed in the semiconductor substrate 10 to define a first active region 11 and a second active region 12 in the pixel region PR1 and the peripheral circuit region PR2, respectively. A trench (not shown) may be formed in the semiconductor substrate 10, and the device isolation layer 13 may be formed by filling the trench with an insulating material (e.g., an insulating oxide). A charge storage region 14 and a well region 16 may be formed in the semiconductor substrate 10 (e.g., the first active region 11). In more detail, P-type dopants may be injected deep into the semiconductor substrate 10 to form the well region 16, and N-type dopants may be injected shallow into the semiconductor substrate 10 to form the charge storage region 14 over the well region 16. A separation region 18 may be formed in the semiconductor substrate 10 (e.g., the first active region 11). The separation region 18 may be spaced apart from the charge storage region 14 and may be formed at a side of the charge storage region 14. The separation region 18 may be formed by injecting P-type dopants into the semiconductor substrate 10.

A shutter gate SG, a transfer gate TG, and a peripheral circuit gate PG may be formed on the semiconductor substrate 10. The shutter gate SG and the transfer gate TG may be formed on the first active region 11 of the pixel region PR1, and the peripheral circuit gate PG may be formed on the second active region 12 of the peripheral circuit region PR2. The shutter gate SG may be formed on the separation region 18 and the charge storage region 14. The transfer gate TG may be formed on the semiconductor substrate 10 at another side of the charge storage region 14. In some embodiments, an insulating layer and a gate electrode layer may be sequentially formed on the semiconductor substrate 10, and the insulating layer and the gate dielectric layer may be patterned to form the shutter gate SG, the transfer gate TG, and the peripheral circuit gate PG. The shutter gate SG may include a shutter gate insulating layer 21a and a shutter gate electrode 21b, and the transfer gate TG may include a transfer gate insulating layer 23a and a transfer gate electrode 23b. The peripheral circuit gate PG may include a peripheral circuit gate insulating layer 25a and a peripheral circuit gate electrode 25b.

An ion implantation mask pattern (not shown) may be formed to cover the shutter gate SG and the transfer gate PG, and N-type dopants may be implanted, using the ion implantation mask pattern and the peripheral circuit gate PG as ion implantation masks, into the semiconductor substrate 10. Thus, a first dopant region 15a may be formed in the semiconductor substrate 10 (e.g., the first active region 11) between the device isolation layer 13 and the separation region 18. The first dopant region 15a may be adjacent the shutter gate SG. In addition, a floating diffusion region 17 adjacent the transfer gate TG may be formed in the semiconductor substrate 10 (e.g., the first active region 11). The floating diffusion region 17 may be spaced apart from the charge storage region 14. Furthermore, third dopant regions 19 may be formed in the semiconductor substrate 10 (e.g., the second active region 12) at both sides of the peripheral circuit gate PG. The third dopant regions 19 may be source/drain regions or well regions.

After the formation of the first dopant region 15a, a P-type dopant may be injected into the first dopant region 15a to form a second dopant region 15b that is shallower than the first dopant region 15a. The first dopant region 15a and the second dopant region 15b may constitute a photoelectric conversion element PD.

Figure 9B:
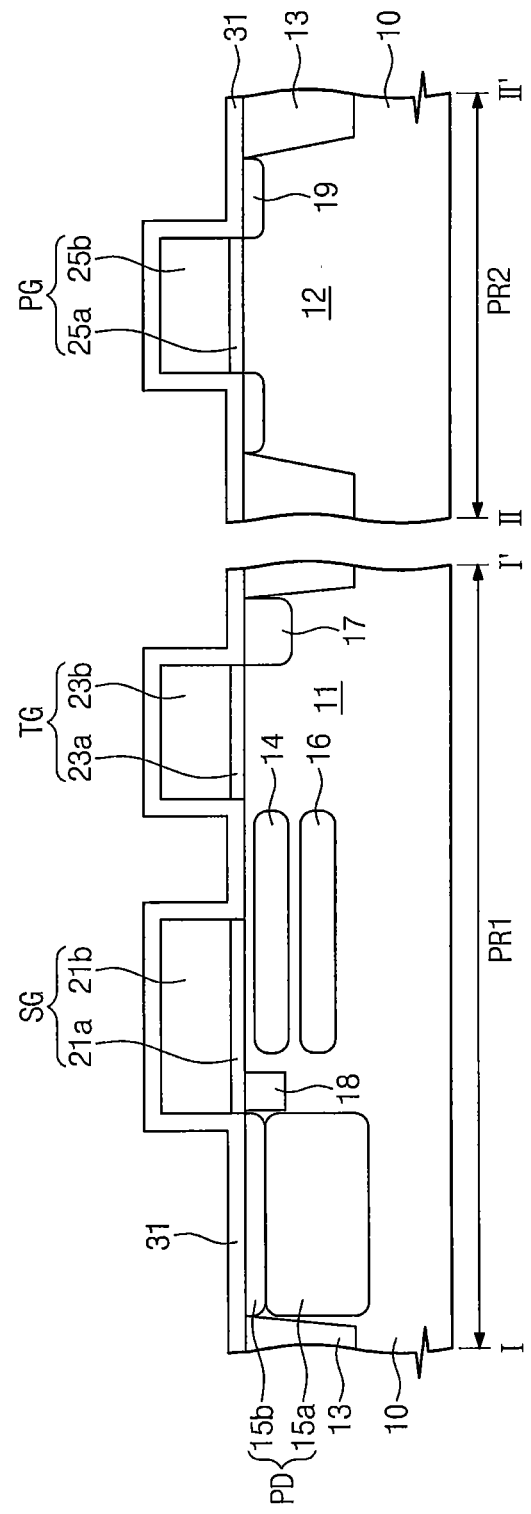

Referring to FIG. 9B, a dielectric layer 31 may be formed on the semiconductor substrate 10. The dielectric layer 31 may be formed to conformally cover the top surface of the semiconductor substrate 10 and surfaces of the gates SG, TG, and PG. The dielectric layer 31 may include a silicon nitride layer.

Figure 9C:
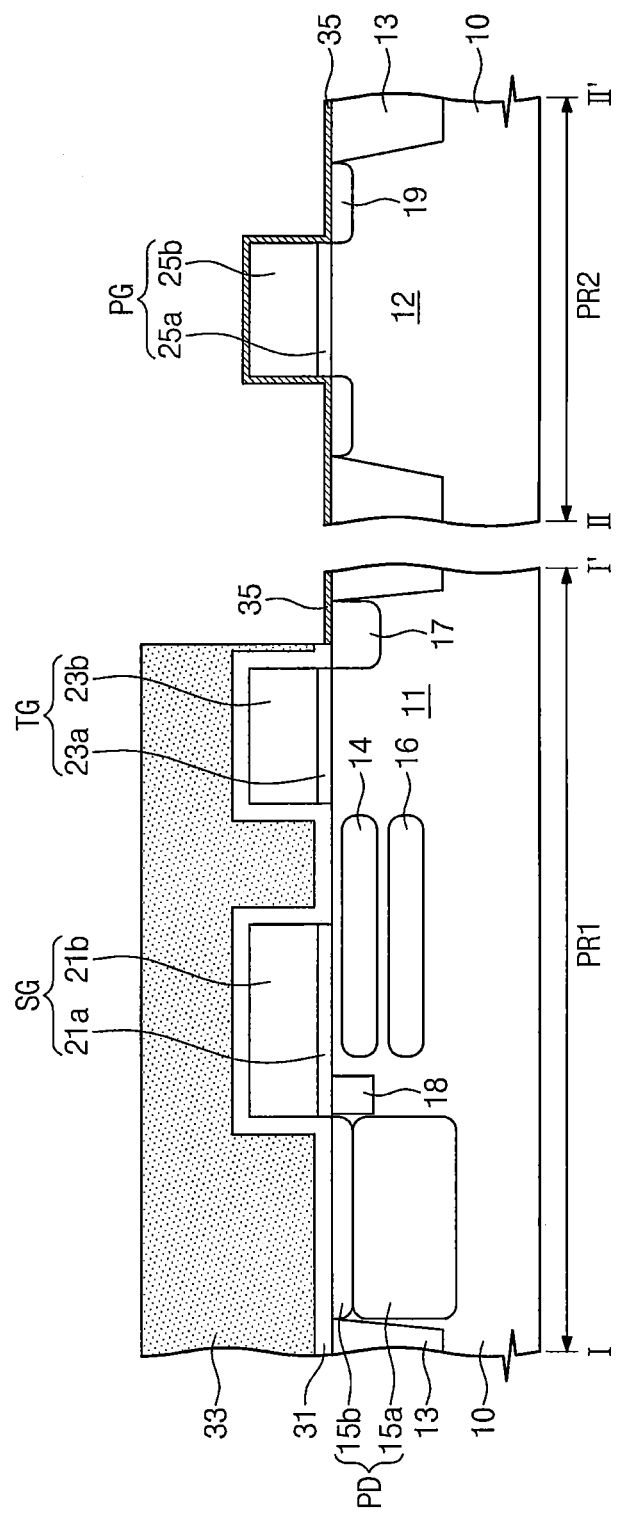

Referring to FIG. 9C, a first mask pattern 33 may be formed on the dielectric layer 31. The first mask pattern 33 may cover the shutter gate SG and the transfer gate TG. At this time, the first mask pattern 33 may expose the dielectric layer 31 that is disposed on a portion of the floating diffusion region 17 and the semiconductor substrate 10 of the peripheral circuit region PR2. The dielectric layer 31 exposed by the first mask pattern 33 may be removed to expose the semiconductor substrate 10 and the peripheral circuit gate PG. A first metal layer 35 may be formed on the semiconductor substrate 10. The first metal layer 35 may be formed on the exposed top surface of the semiconductor substrate 10 and the peripheral circuit gate PG. The first metal layer 35 may cover the exposed portion of the floating diffusion region 17, the top surface of the semiconductor substrate 10 of the peripheral circuit region PR2, and the surface of the peripheral circuit gate PG. In some embodiments, even though not shown in FIG. 9C, the first metal layer 35 may also be formed on the first mask pattern 33. The first metal layer 35 may include cobalt (Co), titanium (Ti), nickel (Ni), and/or tungsten (W).

Figure 9D:
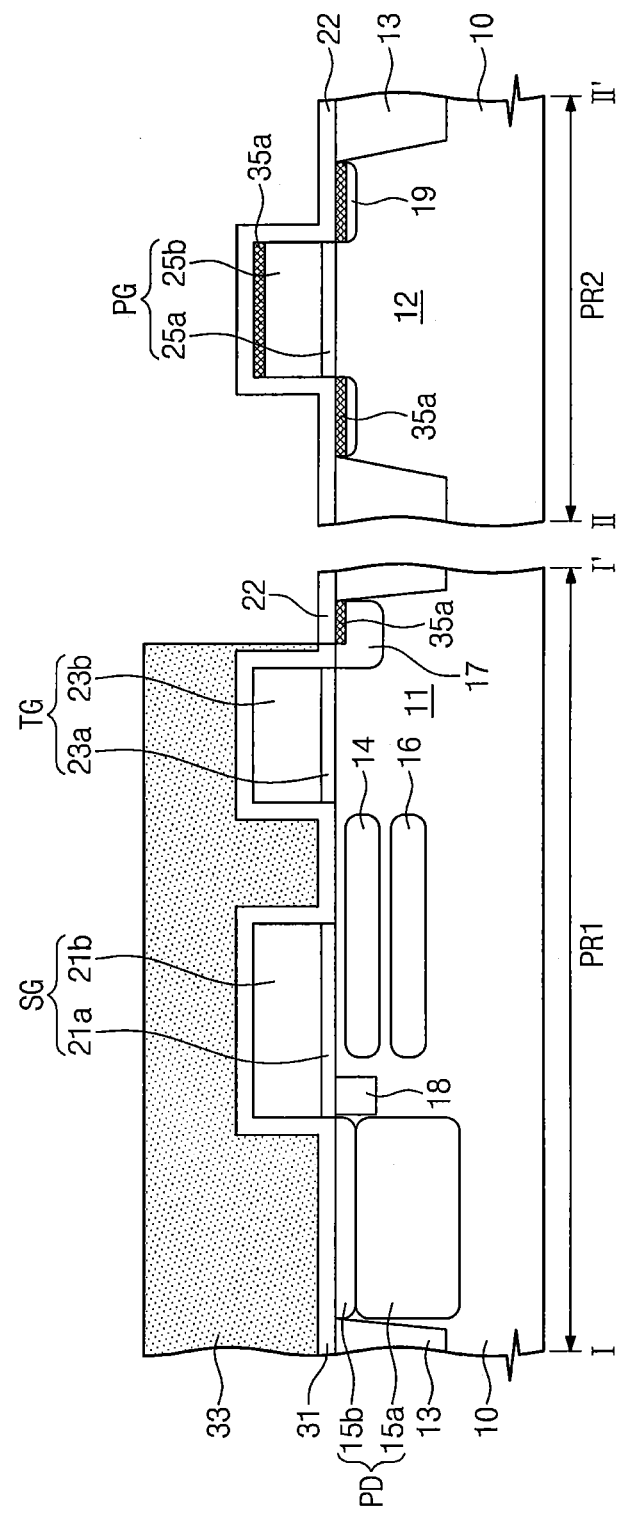

Referring to FIG. 9D, a thermal treatment (e.g., a rapid thermal process (RTP)) may be performed on the semiconductor substrate 10 having the first metal layer 35 to form silicide layers 35a. The first metal layer 35 may react with silicon included in the semiconductor substrate 10 and/or the peripheral circuit gate electrode 25b to form the silicide layers 35a. Thus, the silicide layers 35a may be formed on the portion of the floating diffusion region 17, the third dopant regions 19, and the surface of the peripheral circuit gate electrode 25b, respectively. In some embodiments, even though not shown in the drawings, gate spacers (not shown) may be formed on sidewalls of the gates SG, TG, and PG before the formation of the dielectric layer 31. In this case, the first metal layer 35 may be in contact with the top surface of the peripheral circuit gate electrode 25b. Thus, the silicide layer 35a on the surface of the peripheral circuit gate electrode 21b may be confinedly formed on the top surface of the peripheral circuit gate electrode 21b. An unreacted portion of the first metal layer 35 may be removed after the formation of the silicide layers 35a.

A protection dielectric layer 22 may be formed on the semiconductor substrate 10 exposed by the first mask pattern 33. The protection dielectric layer 22 may cover the silicide layers 35a. A thickness of the protection dielectric layer 22 may be substantially equal to that of the dielectric layer 31. However, the inventive concepts are not limited thereto. For example, the protection dielectric layer 22 may include a silicon nitride layer.

Figure 9E:
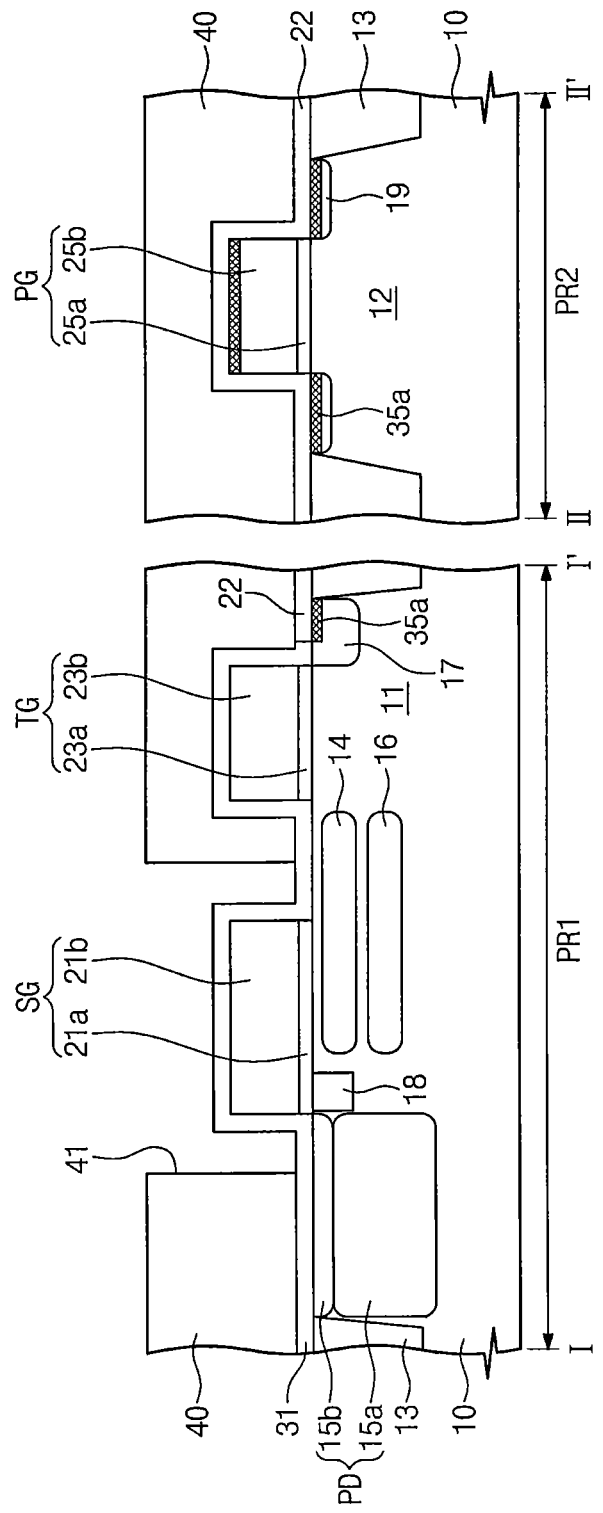

Referring to FIG. 9E, the first mask pattern 33 may be removed, and a first interlayer insulating layer 40 may be then formed on the semiconductor substrate 10. The first interlayer insulating layer 40 may be patterned to form an opening 41 overlapping with the shutter gate SG. In some embodiments, a photoresist pattern (not shown) may be formed on the first interlayer insulating layer 40, and the first interlayer insulating layer 40 may be etched using the photoresist pattern as an etch mask to form the opening 41. The opening 41 may expose a portion of the dielectric layer 31 that covers a top surface and sidewalls of the shutter gate SG and extends from the sidewalls of the shutter gate SG onto a portion of the top surface of the semiconductor substrate 10.

In some embodiments, the opening 41 in the first interlayer insulating layer 40 may overlap with the shutter gate SG and the transfer gate TG. The opening 41 may expose a portion of the dielectric layer 31 that covers the shutter and transfer gates SG and TG and the semiconductor substrate 10 disposed between the shutter and transfer gates SG and TG. In this case, the light shielding layer 45 illustrated in FIG. 8 may be formed in a subsequent process.

Figure 9F:
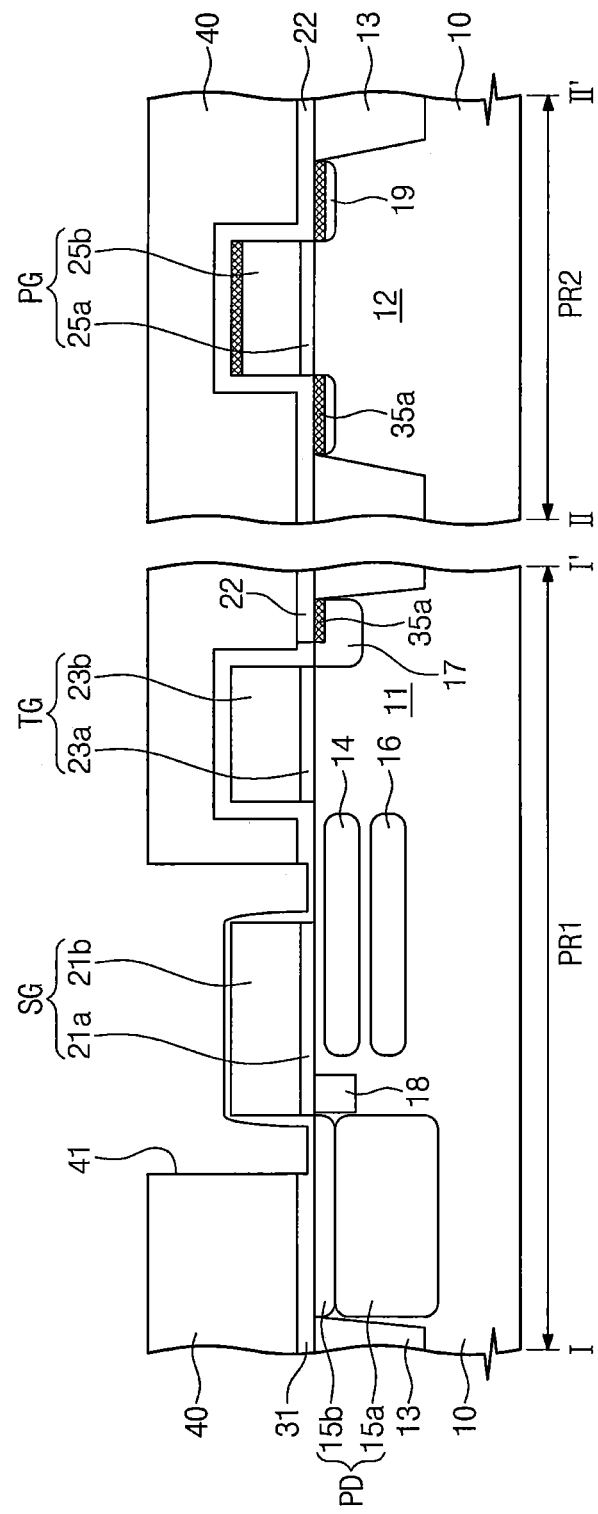

Referring to FIG. 9F, an etch-back process may be performed on the semiconductor substrate 10 having the first interlayer insulating layer 40 with the opening 41. Thus, the dielectric layer 31 exposed by the opening 41 may be recessed.

Figure 9G:
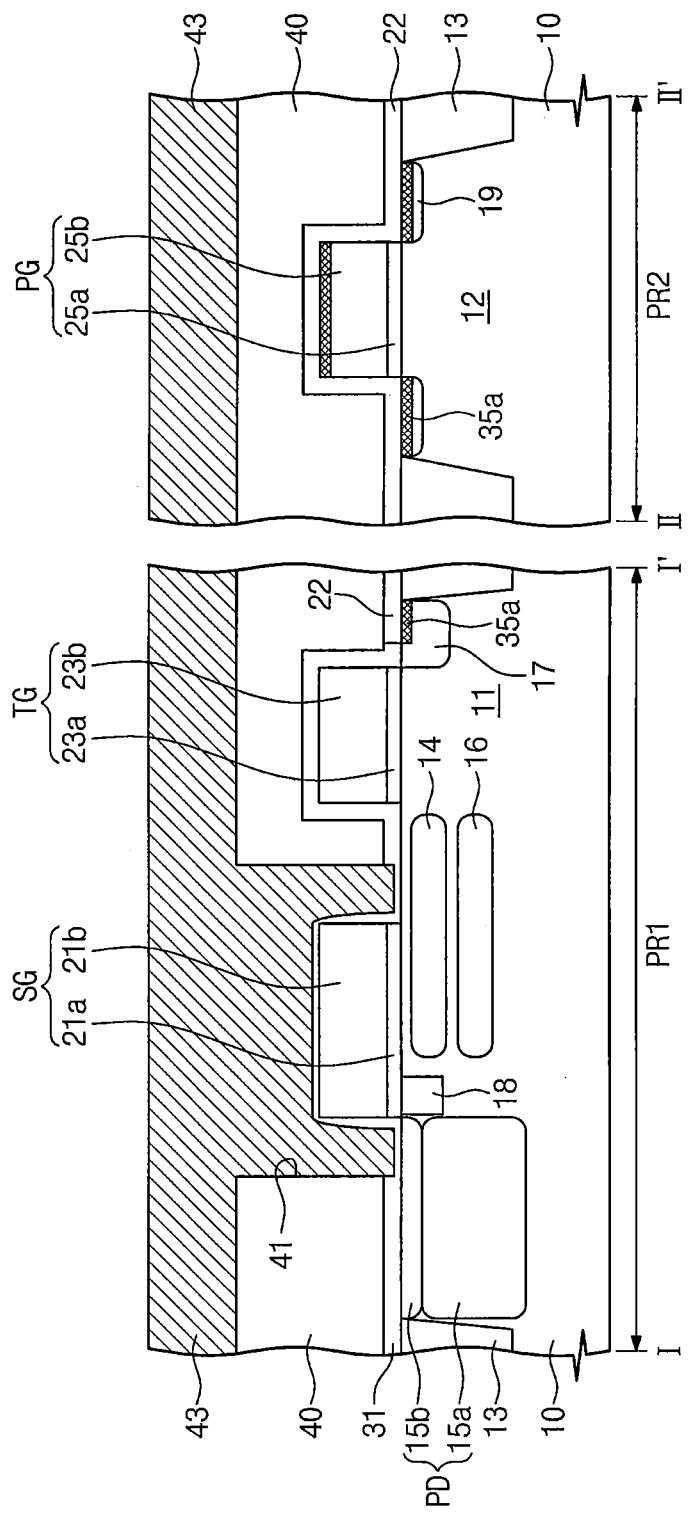
Figure 9H:
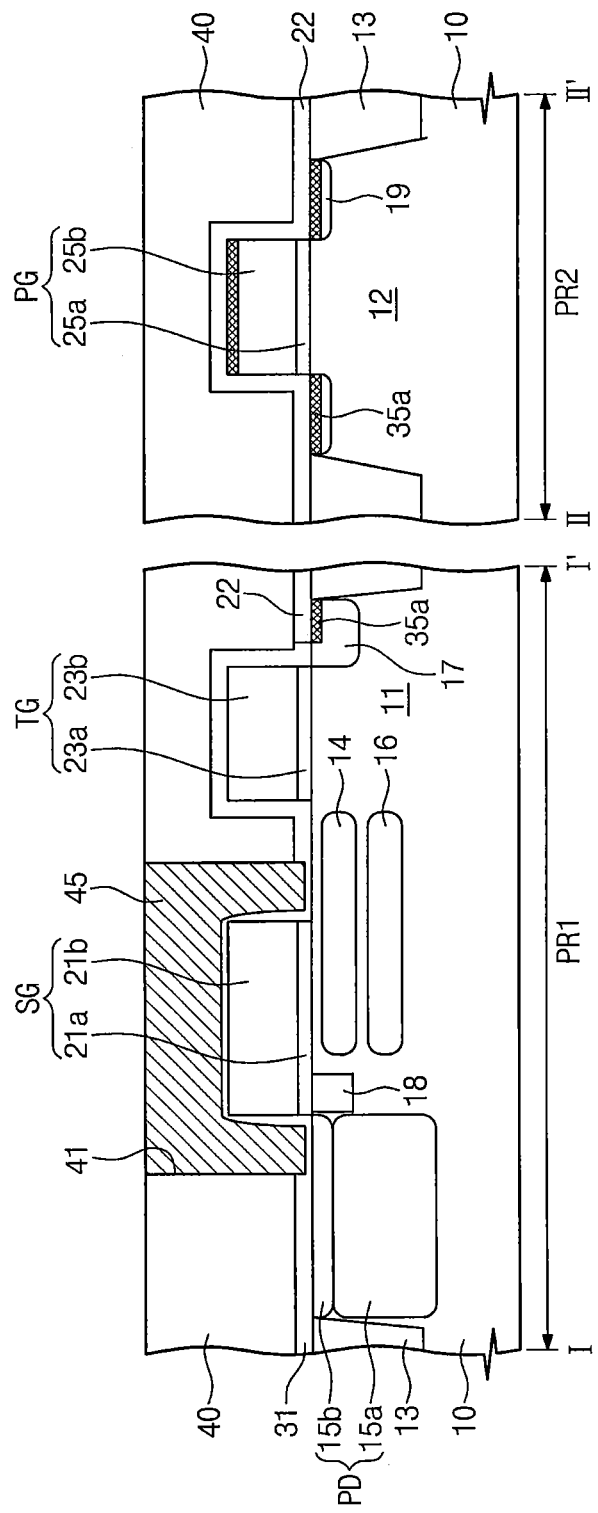

Referring to FIGS. 9G and 9H, a second metal layer 43 may be formed on the first interlayer insulating layer 40 to fill the opening 41. The second metal layer 43 may include aluminum (Al) and/or tungsten (W).

The second metal layer 43 may be planarized unit a top surface of the first interlayer insulating layer 40 is exposed. Thus, the second metal layer 43 disposed on the top surface of the first interlayer insulating layer 40 may be removed, and a light shielding layer 45 may be formed to fill the opening 41. The light shielding layer 45 may be formed to completely cover the top surface and the sidewalls of the shutter gate SG. The planarization process may be performed using a chemical mechanical polishing (CMP) process or an etch-back process. Due to the planarization process, an entire top surface of the light shielding layer 45 may be substantially flat. In addition, the top surface of the light shielding layer 45 may be substantially coplanar with the top surface of the first interlayer insulating layer 40.

Figure 9I:
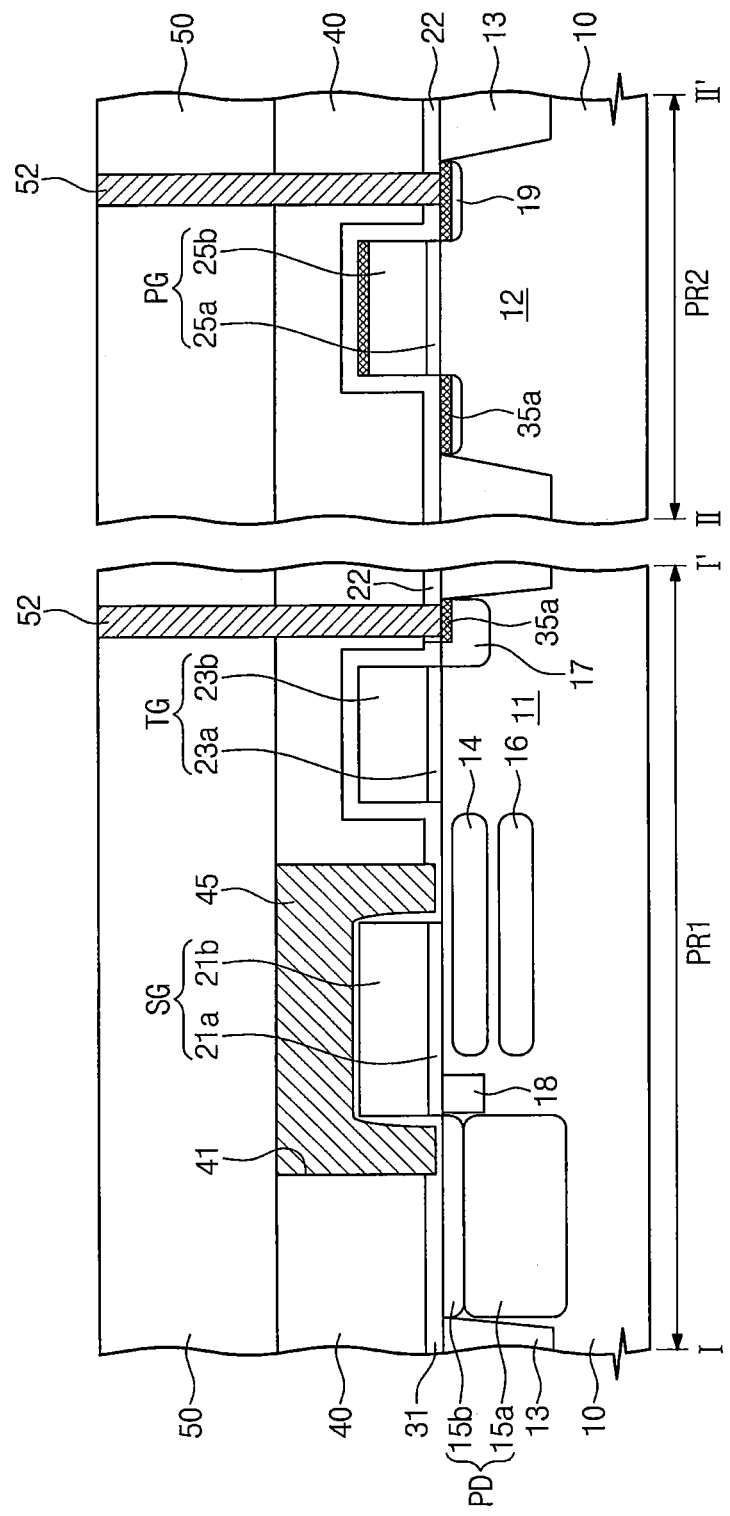

Referring to FIG. 9I, a second interlayer insulating layer 50 may be formed on the first interlayer insulating layer 40. Via-contacts 52 may be formed to penetrate the second interlayer insulating layer 50, the first interlayer insulating layer 40, and the protection dielectric layer 22. The via-contact 52 formed in the pixel region PR1 may be connected to the silicide layer 35a formed on the floating diffusion region 17, and the via-contact formed in the peripheral circuit region PR2 may be connected to the silicide layer 35a formed on the third dopant region 19. The via-contacts 52 may include a metal material such as copper (Cu), aluminum (Al), or tungsten (W).

Referring again to FIG. 3A, interconnections 54 may be formed on the second interlayer insulating layer 50. The interconnections 54 may be in contact with the via-contacts 52. A third interlayer insulating layer 60 may be formed on the second interlayer insulating layer 50 to cover the interconnection 54. A color filter 81 may be formed on the third interlayer insulating layer 60 in the pixel region PR1. The color filter 81 may overlap with the photoelectric conversion element PD. In some embodiments, a color filter layer (not shown) may be formed on the third interlayer insulating layer 60, and the color filter layer may be patterned to form the color filter 81. Next, a planarization layer 83 covering the color filter 81 may be formed on the third interlayer insulating layer 60. The planarization layer 83 may include a plurality of refractive layers. A micro-lens 85 overlapping with the color filter 81 may be formed on the planarization layer 83.

FIGS. 10A to 10G are cross-sectional views taken along lines I-I' and II-II' of FIG. 2 to illustrate methods of fabricating the image sensor according to the second embodiment of the inventive concepts. In the present embodiment, the same elements as described in the first embodiment will be indicated by the same reference numerals or the same reference designators. The descriptions to the same elements as in the first embodiment will be omitted or mentioned briefly for the purpose of ease and convenience in explanation.

Figure 10A:
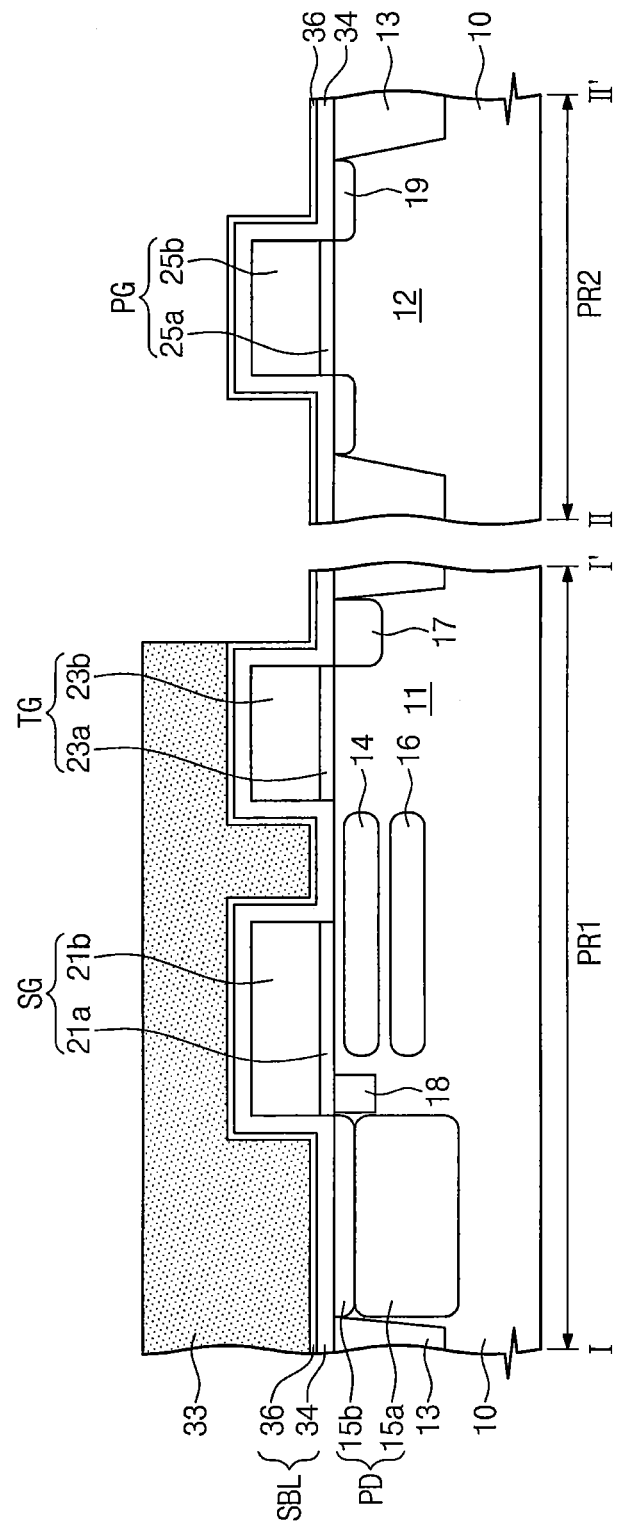
FIGS. 10A to 10G are cross-sectional views taken along lines I-I' and II-II' of FIG. 2 to illustrate a method of fabricating the image sensor according to the second embodiment of the inventive concepts.

Referring to FIG. 10A, a first dielectric layer 34 and a second dielectric layer 36 may be sequentially and conformally formed on the semiconductor substrate 10 having the shutter gate SG, the transfer gate TG, and the peripheral gate PG. The first dielectric layer 34 may be a silicon nitride (SiN) layer, and the second dielectric layer 36 may be a silicon oxide ($SiO_2$) layer. The first dielectric layer 34 and the second dielectric layer 36 may constitute a silicide blocking layer SBL.

A first mask pattern 33 may be formed on the silicide blocking layer SBL of the pixel region PR1. The first mask pattern 33 may expose a portion of the silicide blocking layer SBL covering the floating diffusion region 17 and the silicide blocking layer SBL disposed in the peripheral circuit region PR2.

Figure 10B:
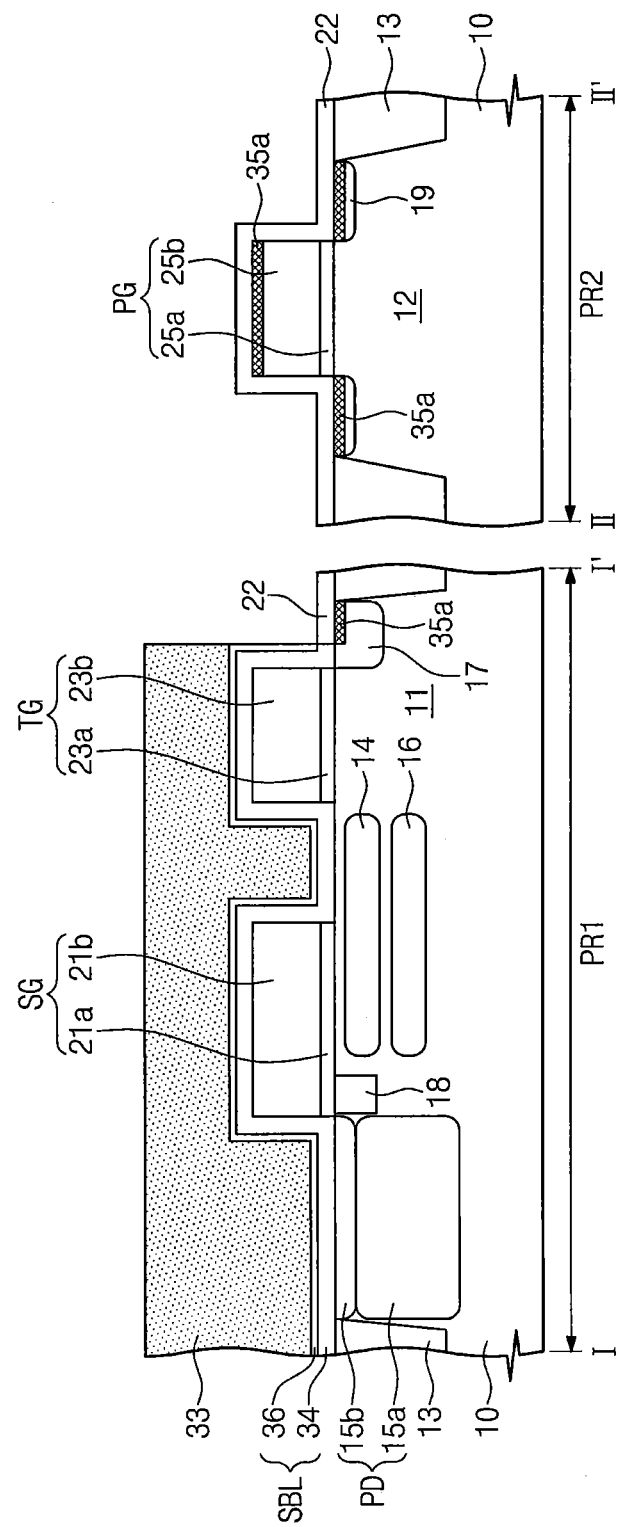

Referring to FIG. 10B, the silicide blocking layer SBL exposed by the first mask pattern 33 may be removed to expose the floating diffusion region 17, the third dopant regions 19, and the peripheral circuit gate electrode 25b. The silicide layers 35a may be formed on the exposed floating diffusion region 17, the exposed third dopant regions 19, and the exposed peripheral circuit gate electrode 25b, respectively. The silicide layer 35a may not be formed on the top surface of the semiconductor substrate 10 that is covered by the silicide blocking layer SBL. The protection dielectric layer 22 may be formed on the semiconductor substrate 10 exposed by the first mask pattern 33. The first mask pattern 33 may be removed after the formation of the silicide layers 35a.

Figure 10C:
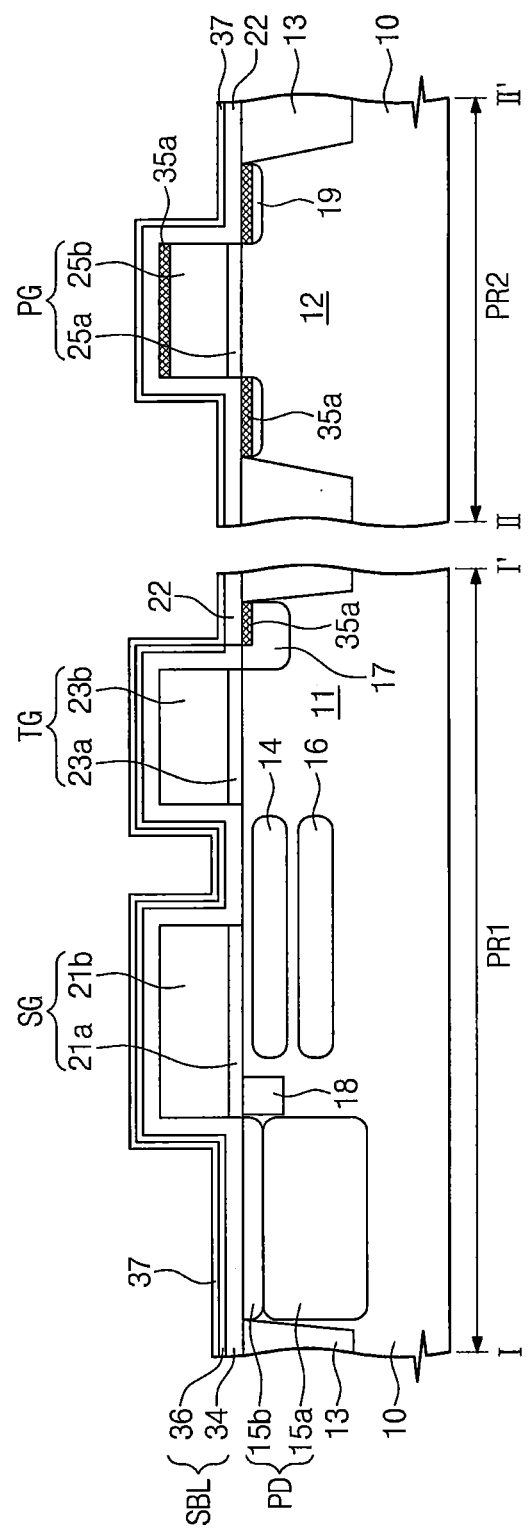

Referring to FIG. 10C, a third dielectric layer 37 may be conformally formed on the semiconductor substrate 10 of the pixel region PR1 and the peripheral circuit region PR2. In more detail, the third dielectric layer 37 may cover a top surface of the second dielectric layer 36 and a top surface of the protection dielectric layer 22. The third dielectric layer 37 may cover the protection dielectric layer 22 formed in the peripheral circuit region PR2. In addition, the third dielectric layer 37 may also cover the protection dielectric layer 22 formed on the floating diffusion region 17. The third dielectric layer 37 may be a silicon oxynitride (SiON) layer.

Figure 10D:
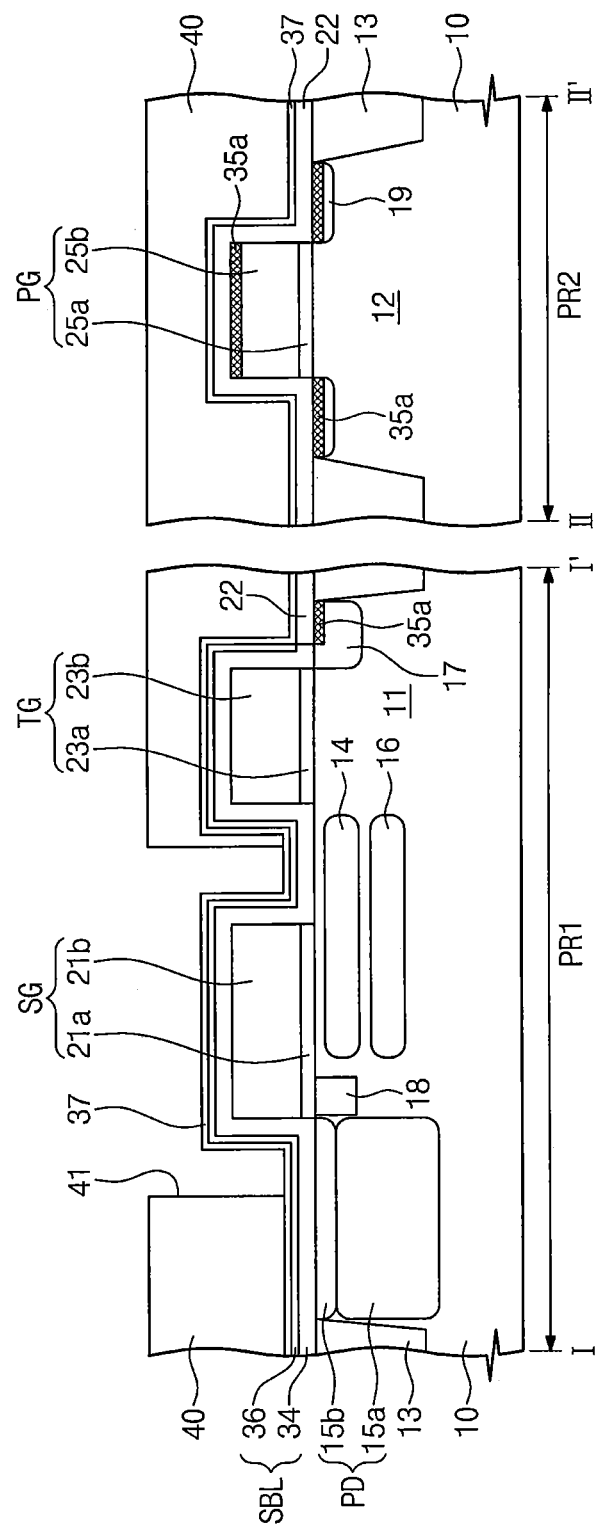

Referring to FIG. 10D, the first interlayer insulating layer 40 having the opening 41 may be formed on the semiconductor substrate 10. The first interlayer insulating layer 40 may be formed to cover the photoelectric conversion element PD, the transfer gate TG, and the peripheral circuit gate PD. The opening 41 may overlap with the shutter gate SG. In more detail, the opening 41 may expose a portion of the third dielectric layer 37 that covers the top surface and the sidewalls of the shutter gate SG and extends onto the top surface of the semiconductor substrate 10.

Figure 10E:
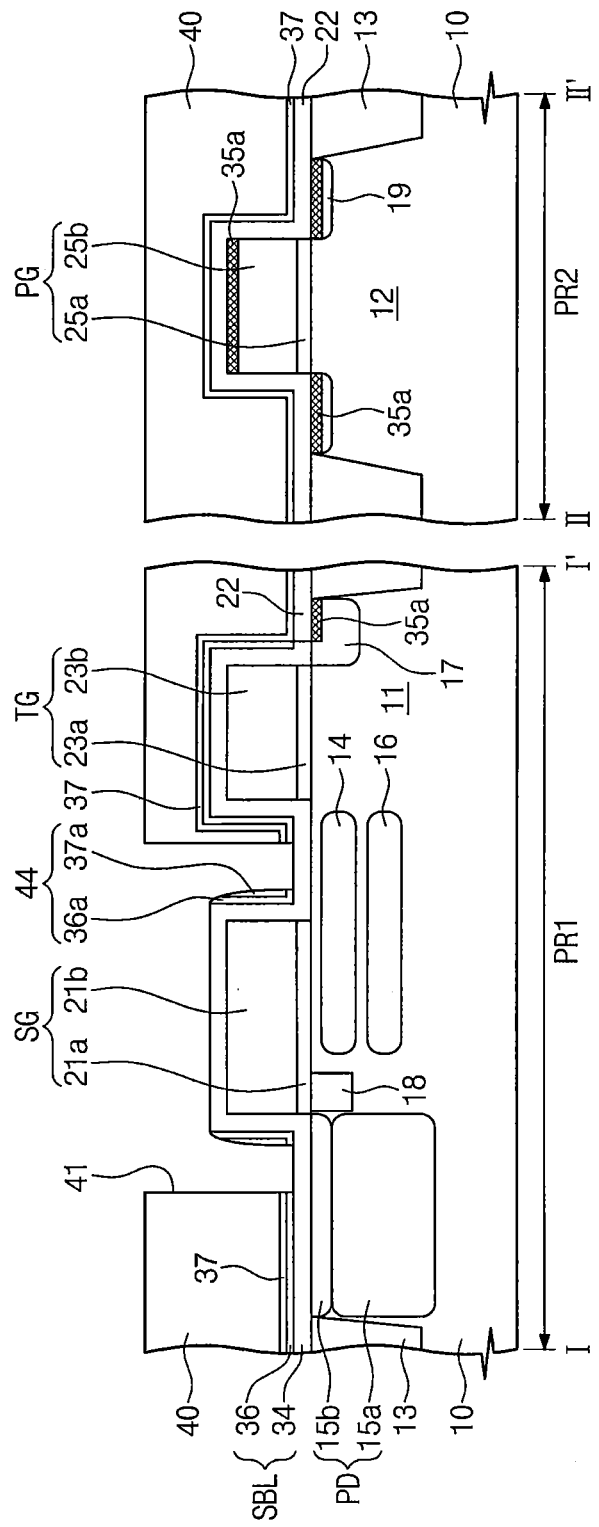

Referring to FIG. 10E, an etch-back process may be performed on the semiconductor substrate 10 having the interlayer insulating layer 40. The third and second dielectric layers 37 and 36 under the opening 41 may be etched by the etch-back process until the top surface of the first insulating layer 34 is exposed. As a result of the etch-back process, spacers 44 may be formed on the sidewalls of the shutter gate electrode SG with the first dielectric layer 34 interposed therebetween. The spacer 44 may include a second dielectric pattern 36a and a third dielectric pattern 37a. The second and third dielectric patterns 36a and 37a may correspond to portions of the second and third dielectric layers 36 and 37 that remain under the opening 41 after the etch-back process.

Figure 10F:
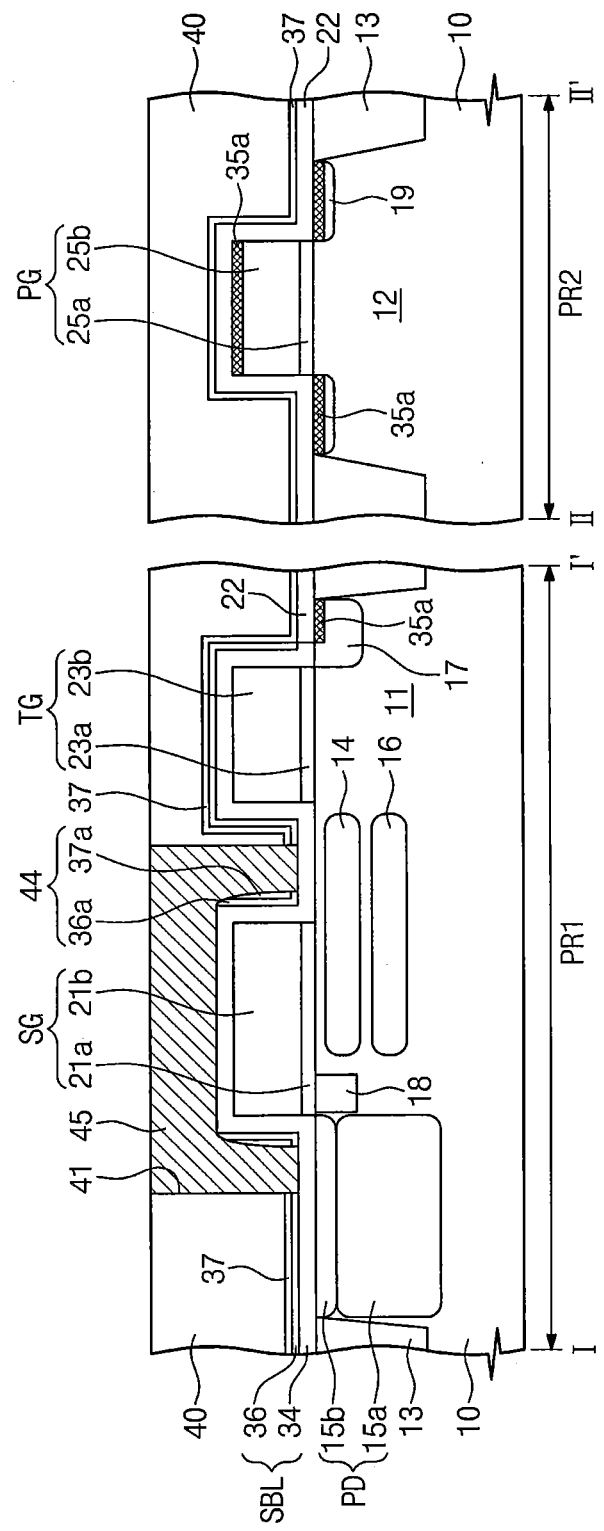
Figure 10G:
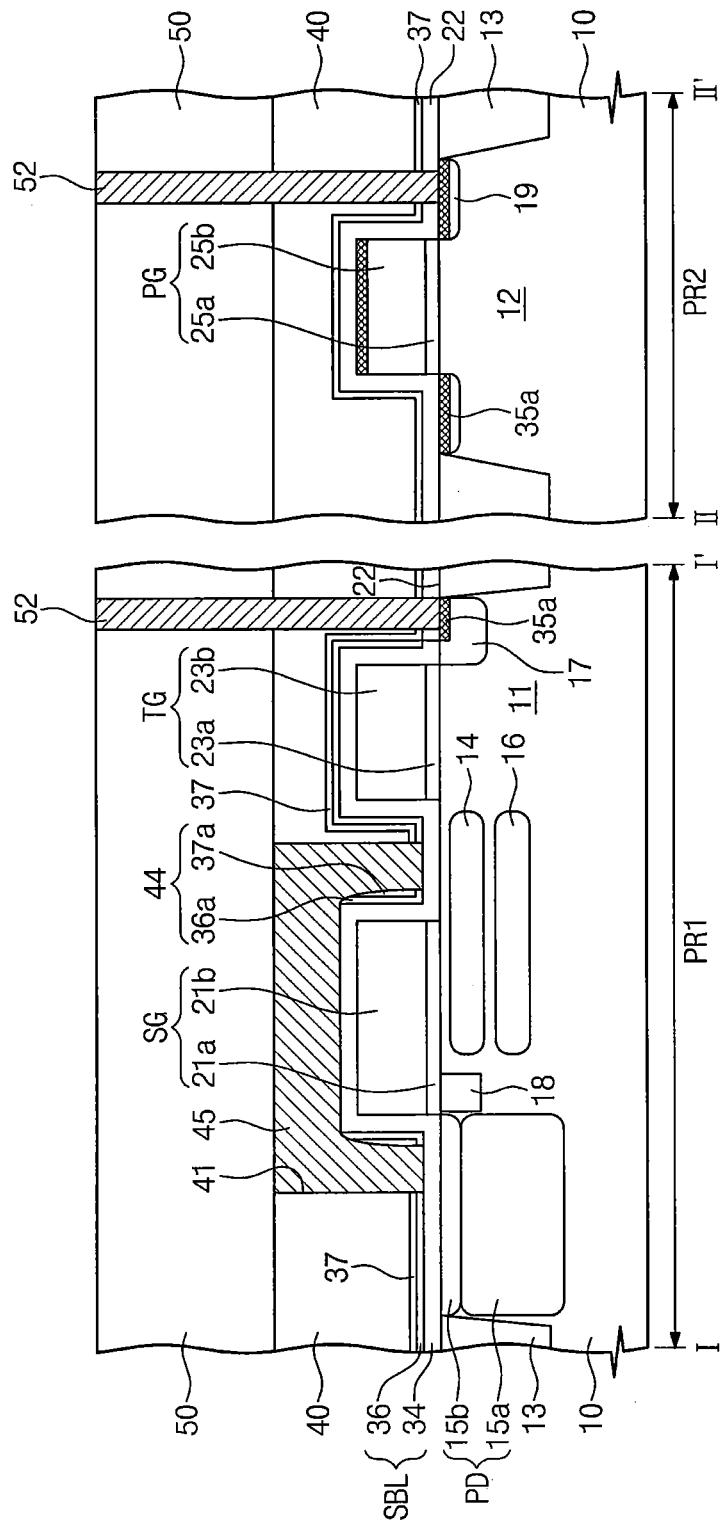

Referring to FIGS. 10F and 10G, the light shielding layer 45 may be formed to fill the opening 41. The second interlayer insulating layer 50 may be formed on the first interlayer insulating layer 40. The via-contacts 52 may be formed to penetrate the second and first interlayer insulating layers 50 and 40. The third dielectric layer 37 may function as an etch stop layer when the second and first interlayer insulating layers 50 and 40 are sequentially etched for the formation of the via-contacts 52. In more detail, the second and first interlayer insulating layers 50 and 40 may be first etched using the third dielectric layer 37 as the etch stop layer. Thereafter, the third insulating layer 37 and the protection dielectric layer 22 may be secondly etched until the semiconductor substrate 10 is exposed. The third dielectric layer 37 used as the etch stop layer may prevent the top surface of the semiconductor substrate 10 from being recessed.

Referring again to FIG. 4A, the interconnections 54 covering the via-contacts 52 may be formed on the second interlayer insulating layer 50. The third interlayer insulating layer 60 covering the interconnections 54 may be formed on the second interlayer insulating layer 50. The color filter 81, the planarization layer 83, and the micro-lens 85 may be sequentially formed on the third interlayer insulating layer 60 of the pixel region PR1.

FIGS. 11A to 11F are cross-sectional views taken along lines I-I' and II-II' of FIG. 2 to illustrate methods of fabricating the image sensor according to the third embodiment of the inventive concepts. In the present embodiment, the same elements as described in the first and second embodiments will be indicated by the same reference numerals or the same reference designators. The descriptions to the same elements as in the first and second embodiments will be omitted or mentioned briefly for the purpose of ease and convenience in explanation.

Figure 11A:
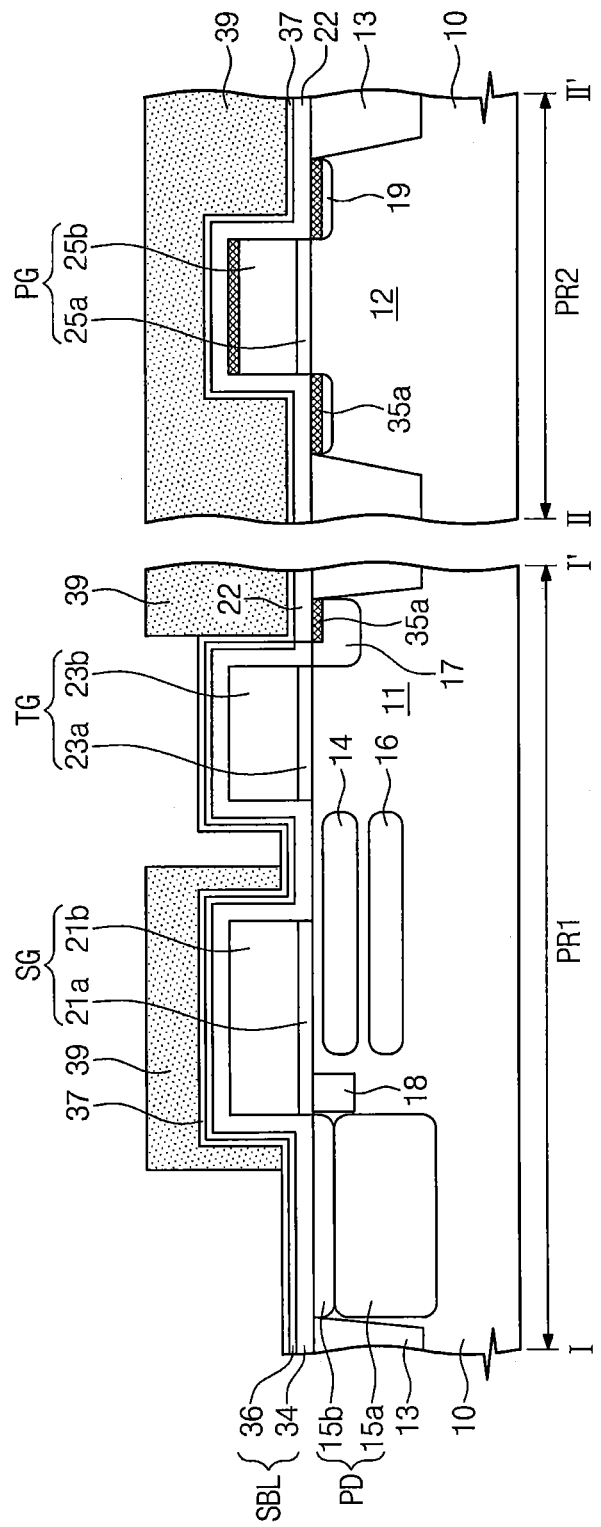
FIGS. 11A to 11F are cross-sectional views taken along lines I-I' and II-II' of FIG. 2 to illustrate a method of fabricating the image sensor according to the third embodiment of the inventive concepts.

Referring to FIG. 11A, a second mask pattern 39 may be formed on the semiconductor substrate 10. In some embodiments, the second mask pattern 39 may be formed on the third dielectric layer 37 of the structure illustrated in FIG. 10C. In detail, the second mask pattern 39 may cover the shutter gate SG. In addition, the second mask pattern 39 may further cover the floating diffusion region 17. Furthermore, the second mask pattern 39 may completely cover the semiconductor substrate 10 of the peripheral circuit region PR2.

Figure 11B:
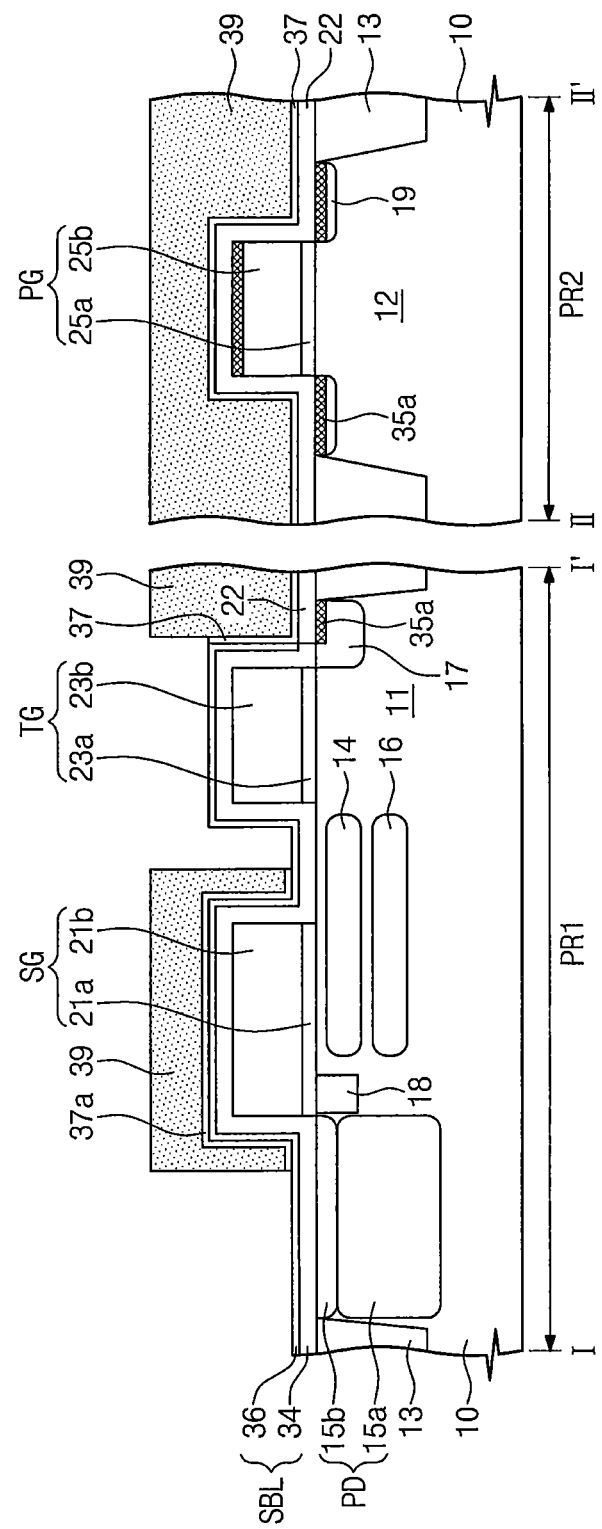

Referring to FIG. 11B, the third dielectric layer 37 exposed by the second mask pattern 39 may be etched to form a third dielectric pattern 37a covering the shutter gate SG. Thus, the second dielectric layer 36 formed on the photoelectric conversion element PD and the transfer gate TG may be exposed.

Figure 11C:
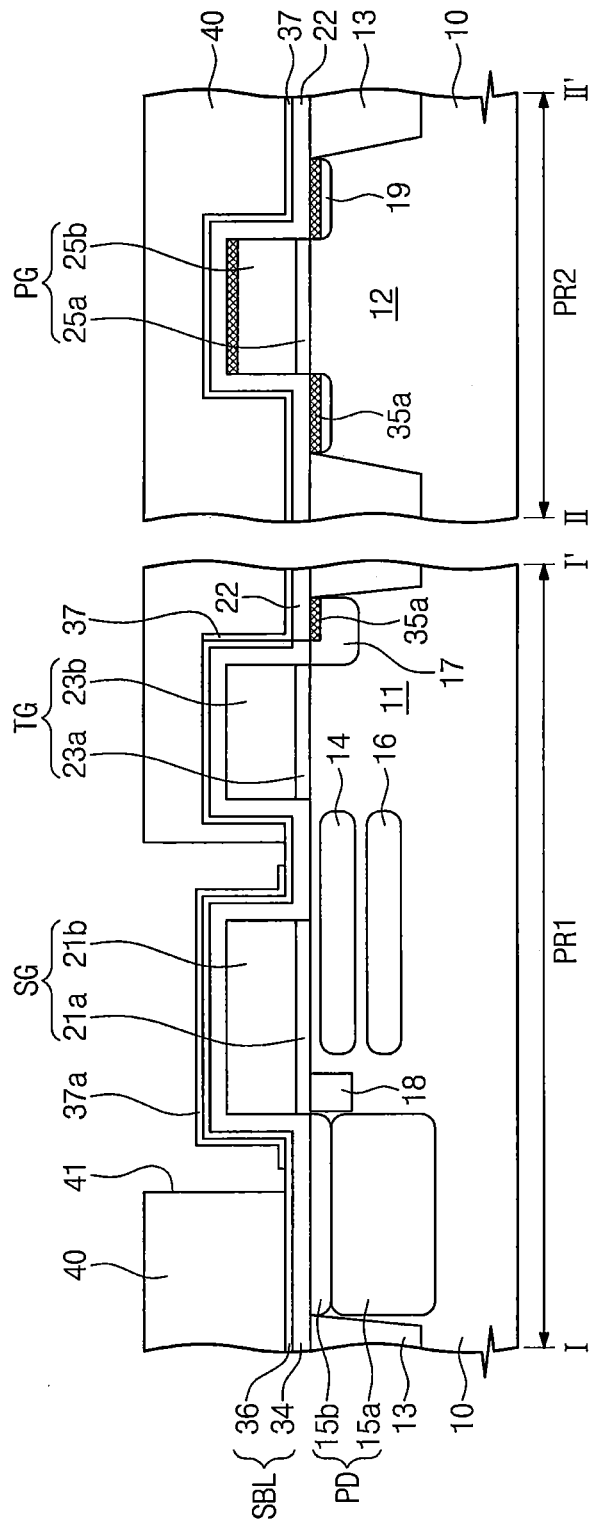

Referring to FIG. 11C, the second mask pattern 39 may be removed after the formation of the third dielectric pattern 37a. The first interlayer insulating layer 40 may be formed on the semiconductor substrate 10. The first interlayer insulating layer 40 may be formed to cover the photoelectric conversion element PD, the transfer gate TG, the floating diffusion region 17, and the semiconductor substrate 10 of the peripheral circuit region PR2. The first interlayer insulating layer 40 may include the opening 41 overlapping the shutter gate SG. In more detail, the opening 41 may expose the third dielectric pattern 37a covering the shutter gate SG and a portion of the second dielectric layer 36. The portion of the second dielectric layer 36, which is exposed by the opening 41, may be adjacent both ends of the third dielectric pattern 37a and be exposed by the third dielectric pattern 37a.

Figure 11D:
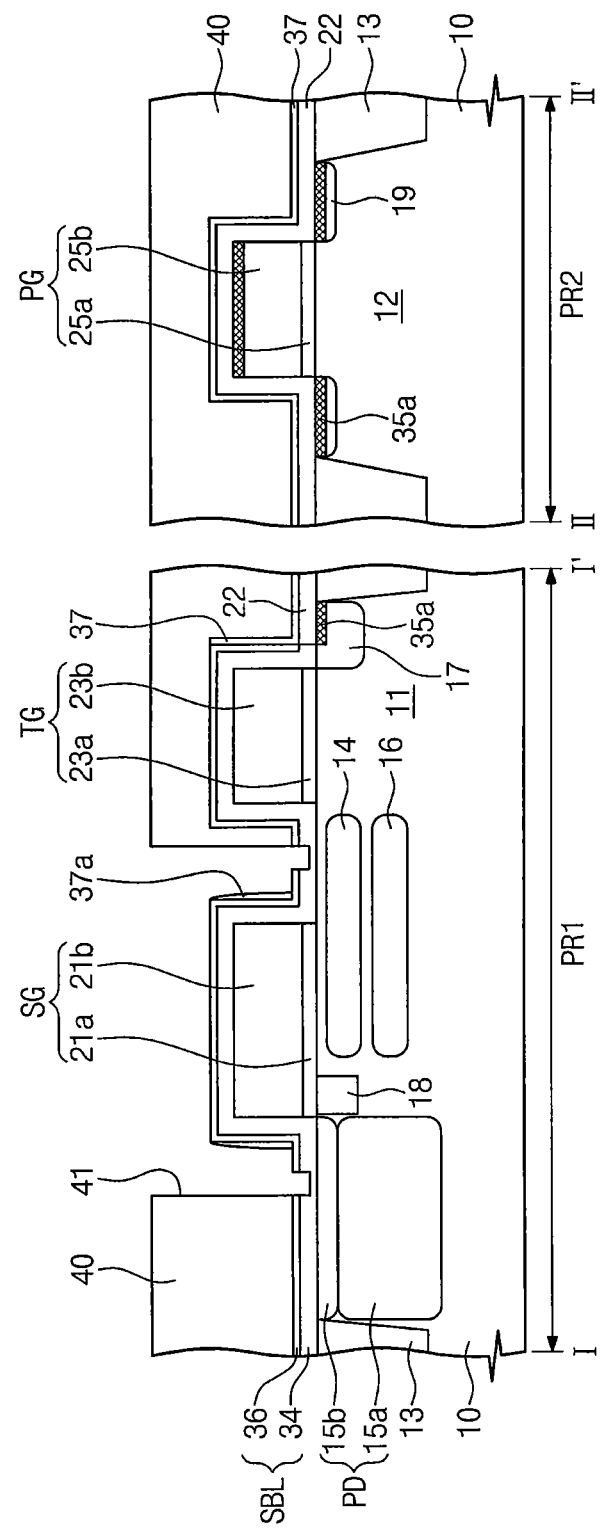

Referring to FIG. 11D, an etch-back process may be performed on the first interlayer insulating layer 40 having the opening 41 to etch the third dielectric pattern 37a. At this time, the portion of the second dielectric layer 36 exposed by the opening 41 and the third dielectric pattern 37a may be etched by the etch-back process, and the first dielectric layer 34 disposed under the portion of the second dielectric layer 36 may be recessed by over-etching. After the etch-back process, the third dielectric pattern 37a having a spacer shape may remain on the sidewalls of the shutter gate SG with the second dielectric layer 36 interposed therebetween.

Figure 11E:
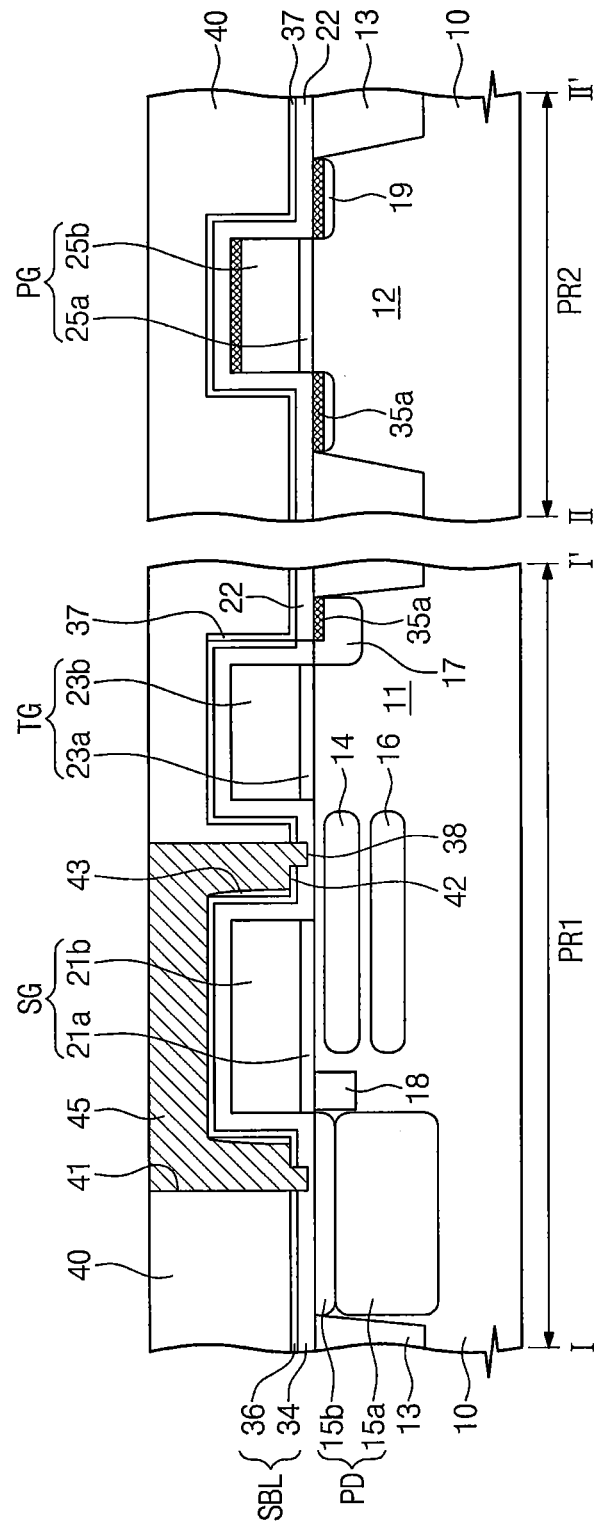

Referring to FIG. 11E, the light shielding layer 45 may be formed to fill the opening 41. Thus, first bottom surfaces 38 of the light shielding layer 45 at both sides of the shutter gate SG may be lower than the top surface of the first dielectric layer 34 and higher than the top surface of the semiconductor substrate 10. A second bottom surface 42 of the light shielding layer 45 disposed between the third dielectric pattern 37a and each of the first bottom surfaces 38 may be coplanar with the top surface of the second dielectric layer 36.

Figure 11F:
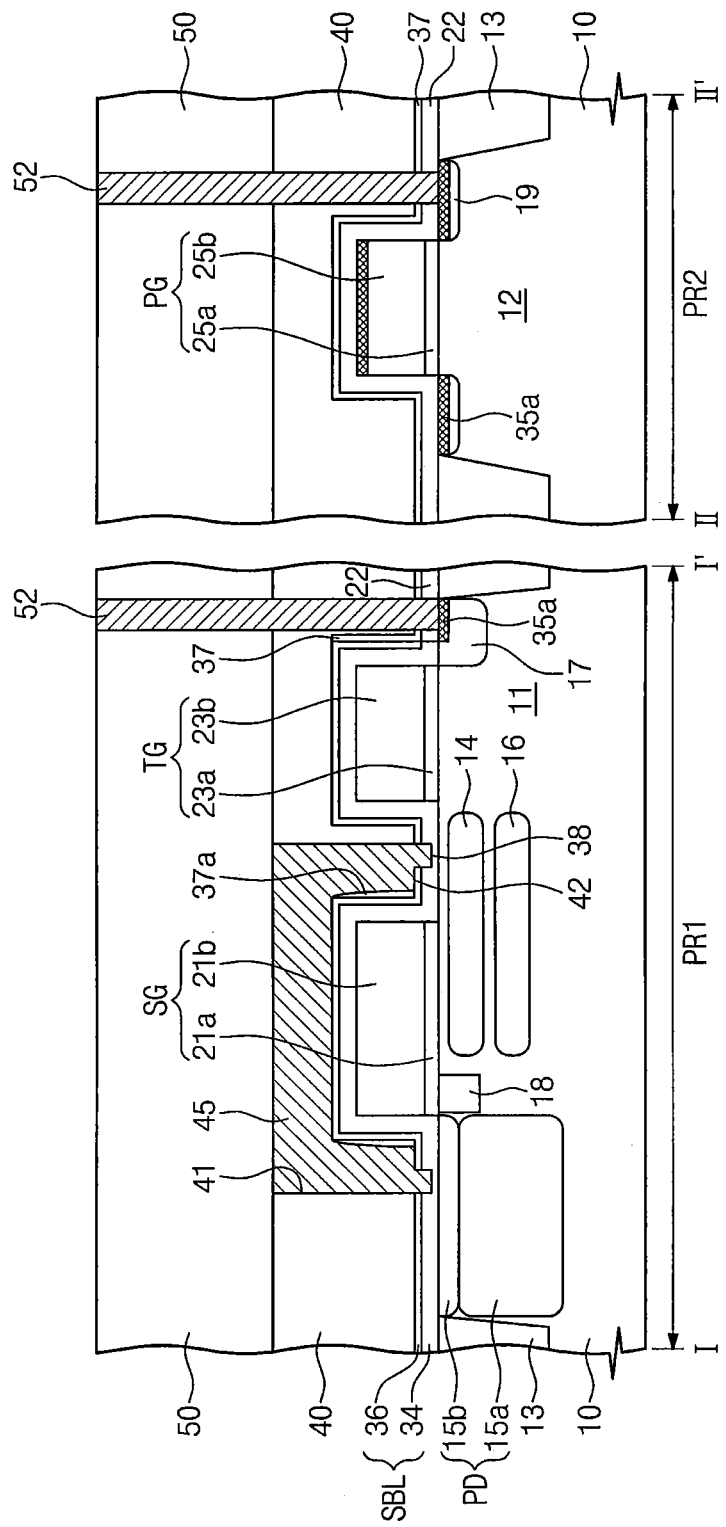

Referring to FIG. 11F, the second interlayer insulating layer 50 may be formed on the first interlayer insulating layer 40. The via-contacts 52 may be formed to penetrate the second and first interlayer insulating layers 50 and 40, the third dielectric layer 37, and the protection layer 22.

Referring again to FIG. 5A, the interconnections 54 covering the via-contacts 52 may be formed on the second interlayer insulating layer 50. The third interlayer insulating layer 60 covering the interconnections 54 may be formed on the second interlayer insulating layer 50. The color filter 81, the planarization layer 83, and the micro-lens 85 may be sequentially formed on the third interlayer insulating layer 60 of the pixel region PR1.

FIGS. 12A to 12E are cross-sectional views taken along lines I-I' and II-II' of FIG. 2 to illustrate methods of fabricating the image sensor according to the fourth embodiment of the inventive concepts. In the present embodiment, the same elements as described in the first to fourth embodiments will be indicated by the same reference numerals or the same reference designators. The descriptions to the same elements as in the first to fourth embodiments will be omitted or mentioned briefly for the purpose of ease and convenience in explanation.

Figure 12A:
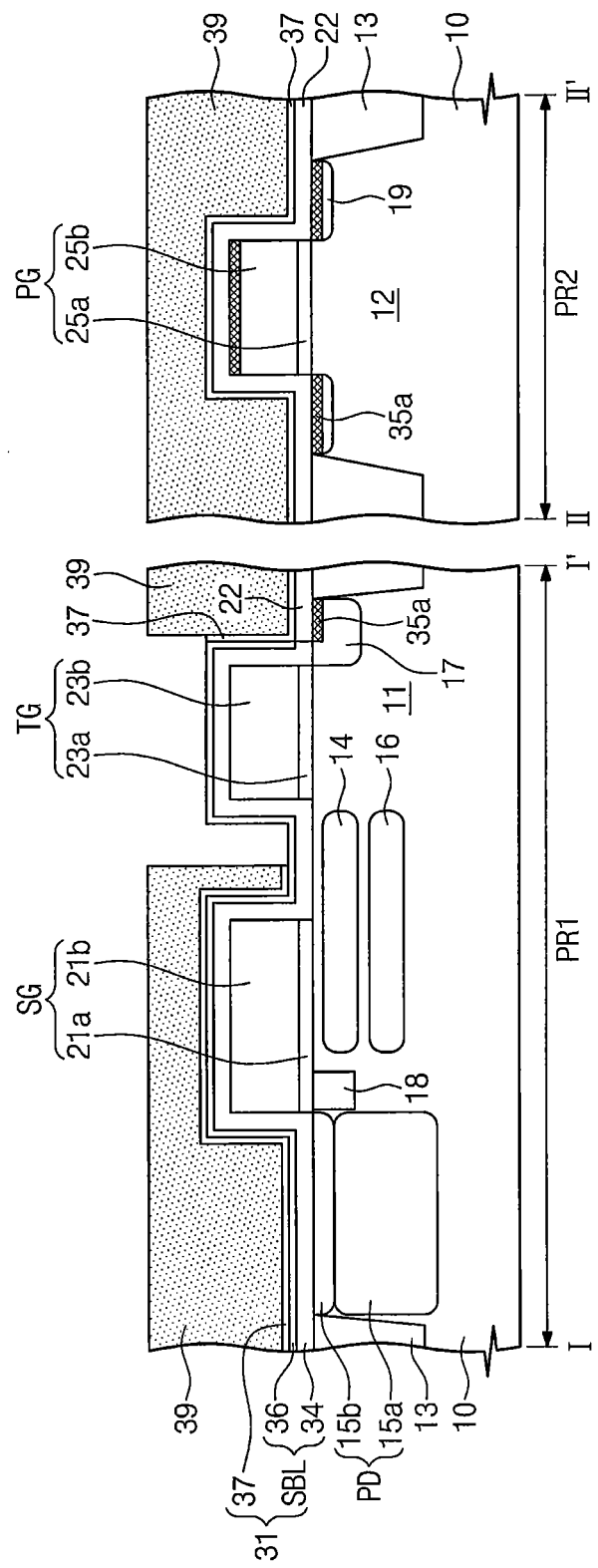
FIGS. 12A to 12E are cross-sectional views taken along lines I-I' and II-II' of FIG. 2 to illustrate a method of fabricating the image sensor according to the fourth embodiment of the inventive concepts.

Referring to FIG. 12A, a second mask pattern 39 may be formed on the semiconductor substrate 10. The second mask pattern 39 may be formed on the third dielectric layer 37 except a portion of the third dielectric layer 37 that is formed on the transfer gate TG. The third dielectric layer 37 exposed by the second mask pattern 39 may be removed to expose the second dielectric layer 36 formed on the transfer gate TG.

Figure 12B:
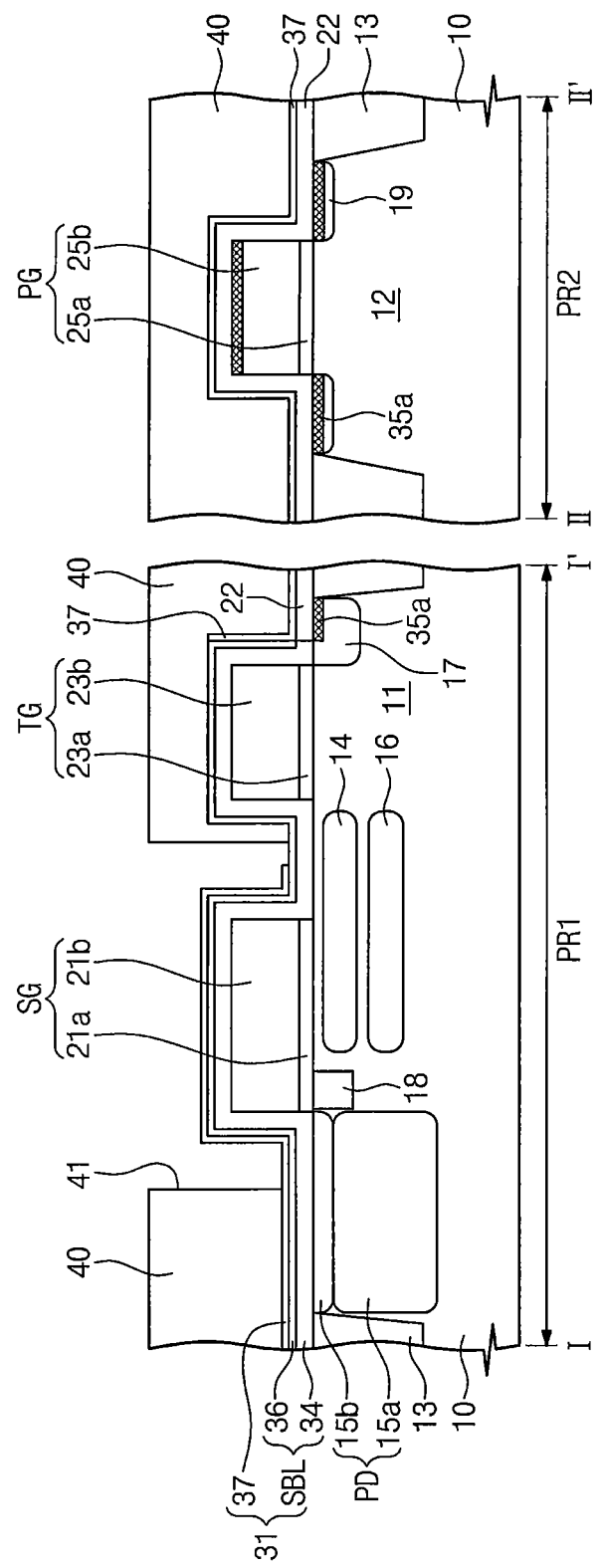

Referring to FIG. 12B, the second mask pattern 39 may be removed, and then, the first interlayer insulating layer 40 may be formed on the semiconductor substrate 10. The first interlayer insulating layer 40 may be formed on the photoelectric conversion element PD, the transfer gate TG, the floating diffusion region 17, and the semiconductor substrate 10 of the peripheral circuit region PR2. The first interlayer insulating layer 40 may have the opening 41 overlapping with the shutter gate SG. In more detail, the opening 41 may expose the third dielectric layer 37 covering the shutter gate SG. In addition, the opening 41 may also expose the third dielectric layer 37 that extends from one sidewall of the shutter gate SG onto the photoelectric conversion element PD. Furthermore, the opening 41 may further expose a portion of the second dielectric layer 36 that is exposed by the third dielectric layer 37 disposed between the shutter gate SG and the transfer gate TG.

Figure 12C:
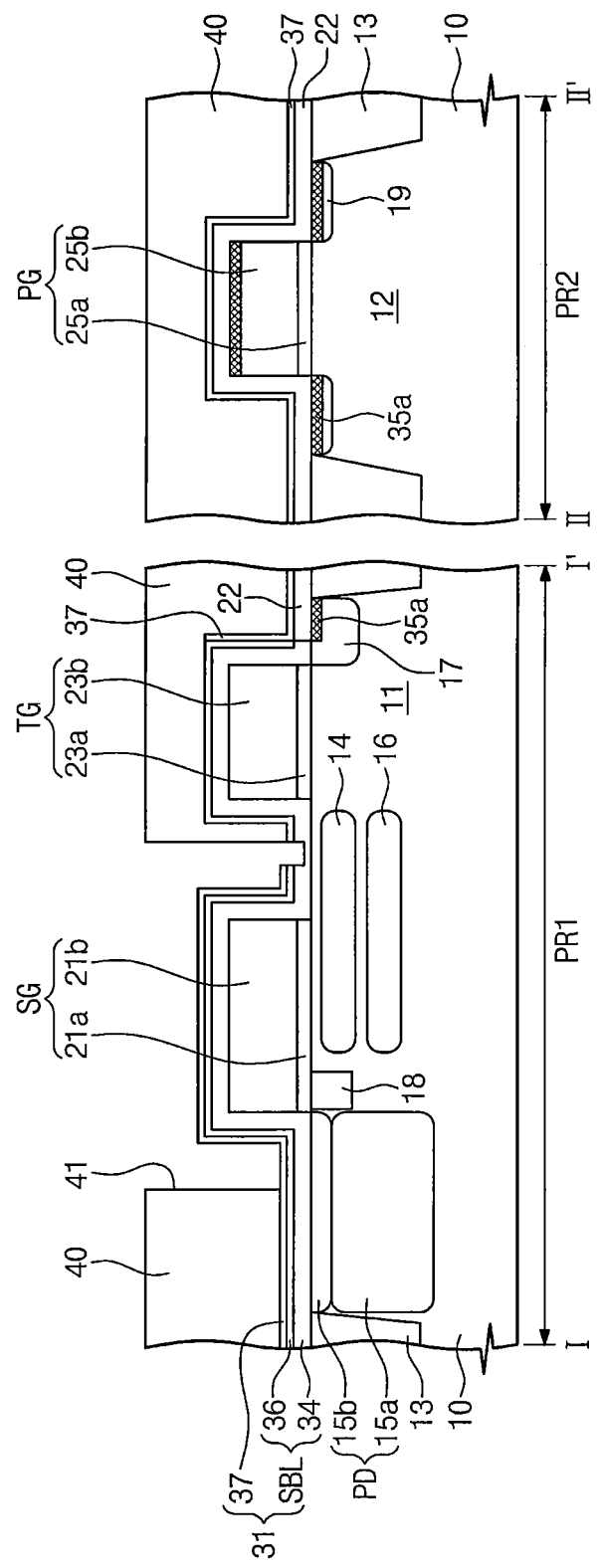

Referring to FIG. 12C, an etch-back process may be performed on the first interlayer insulating layer 40 having the opening 41 to etch the portion of the second dielectric layer 36 exposed by the third dielectric layer 37. During the etch-back process, the second dielectric layer 36 may be over-etched to recess the top surface of the first dielectric layer 34 disposed thereunder.

Figure 12D:
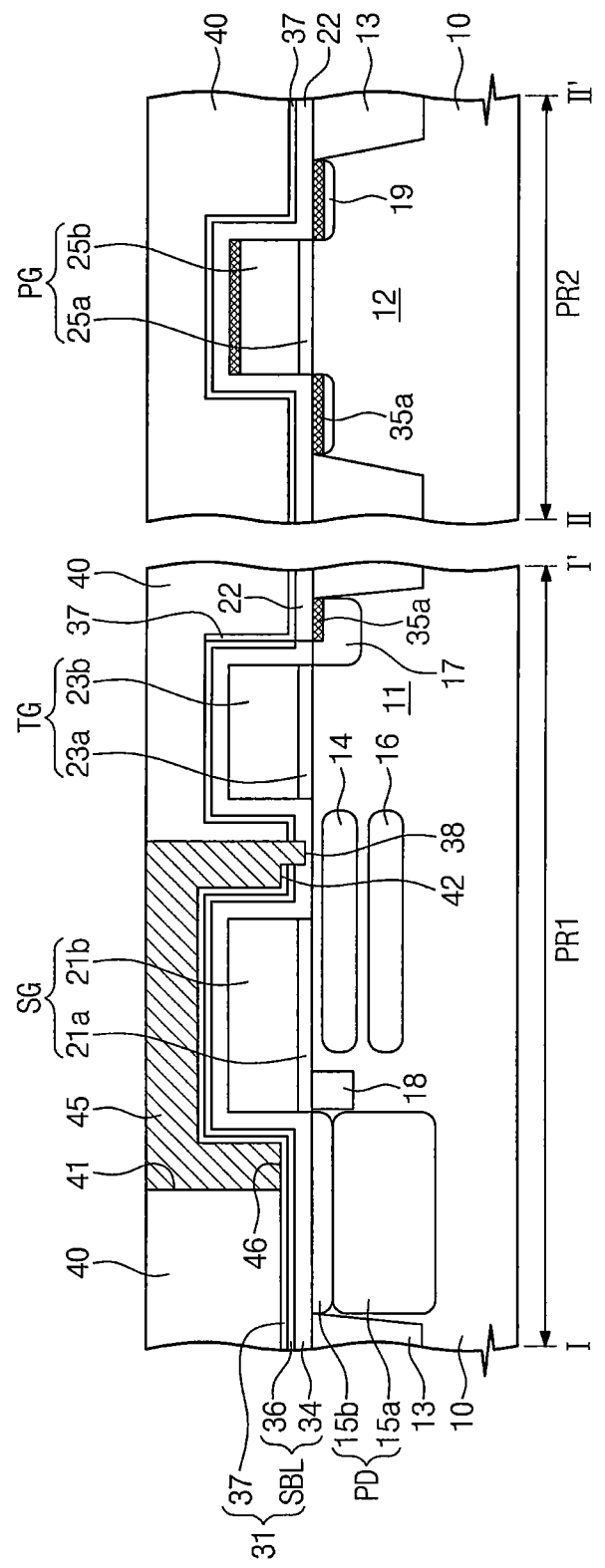

Referring to FIG. 12D, the light shielding layer 45 may be formed to fill the opening 41. Thus, a first bottom surface 38 of the light shielding layer 45 at a side of the shutter gate SG may be lower than the top surface of the first dielectric layer 34 and higher than the top surface of the semiconductor substrate 10. A second bottom surface 42 of the light shielding layer 45 disposed at the side of the shutter gate SG may be coplanar with the top surface of the third dielectric layer 37. A third bottom surface 46 of the light shielding layer 45 disposed at another side of the shutter gate SG may be coplanar with the second bottom surface 42 of the light shielding layer 45.

Figure 12E:
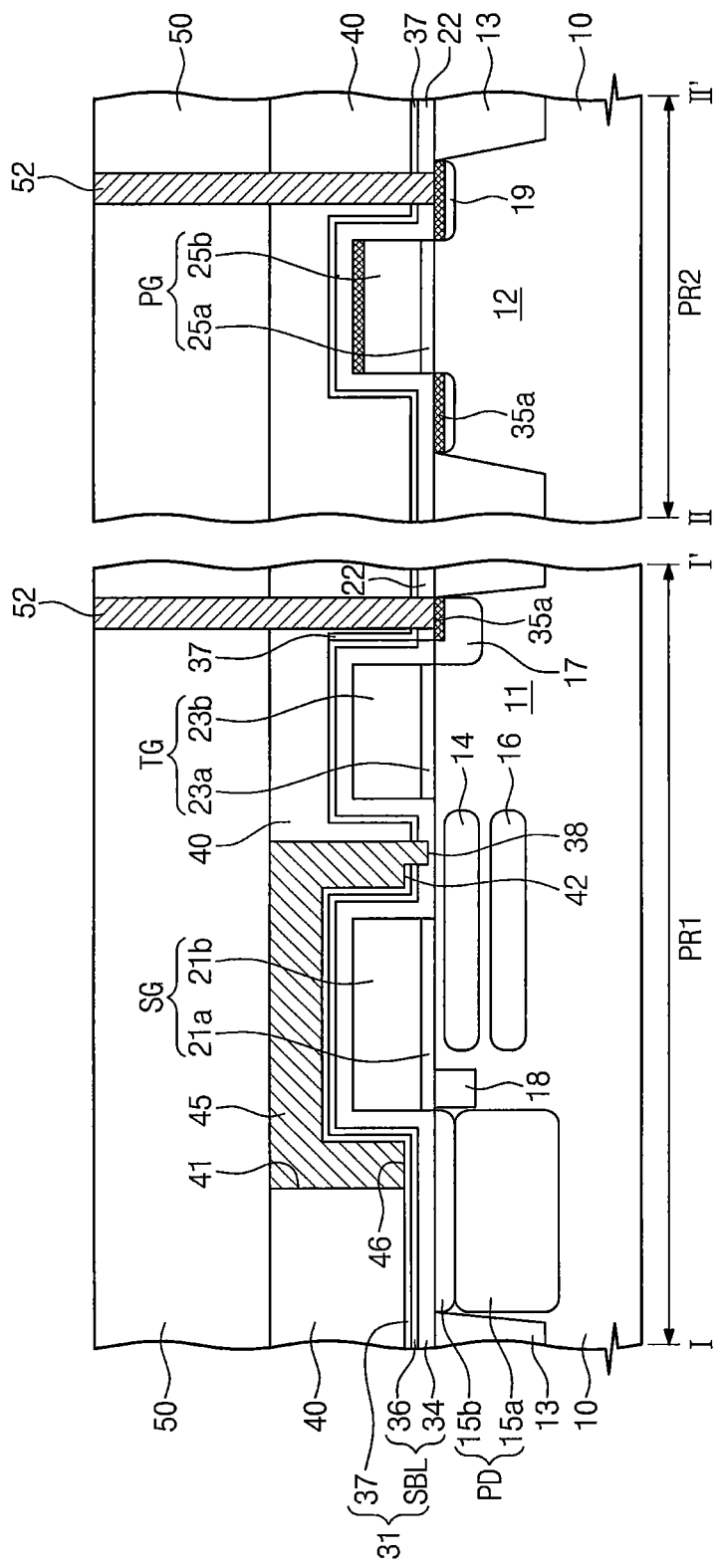
Figure 13:
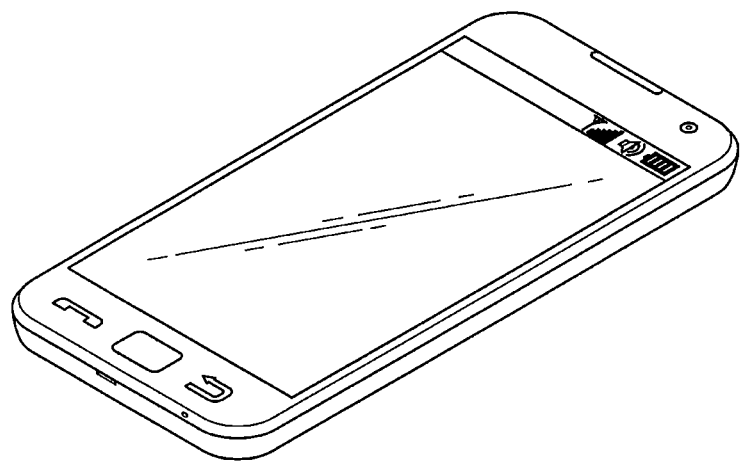
FIGS. 13 to 17 illustrate examples of multimedia devices implemented with image sensors according to embodiments of the inventive concepts.
Figure 14:
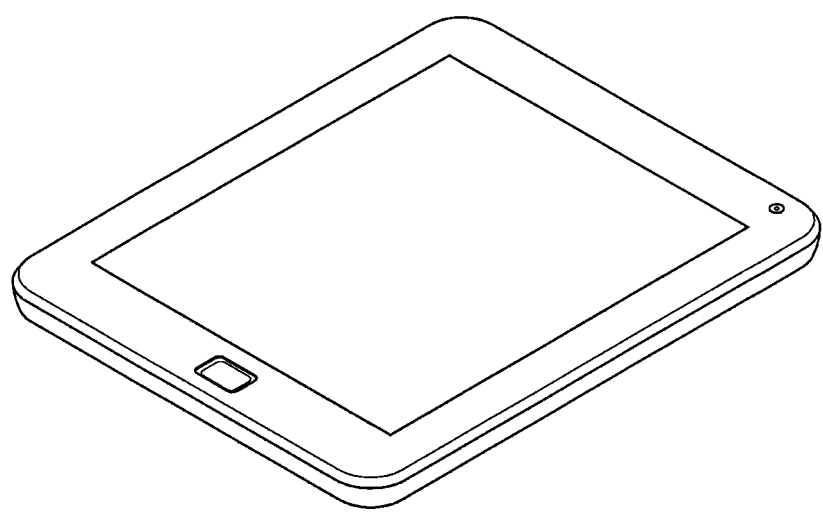
Figure 15:
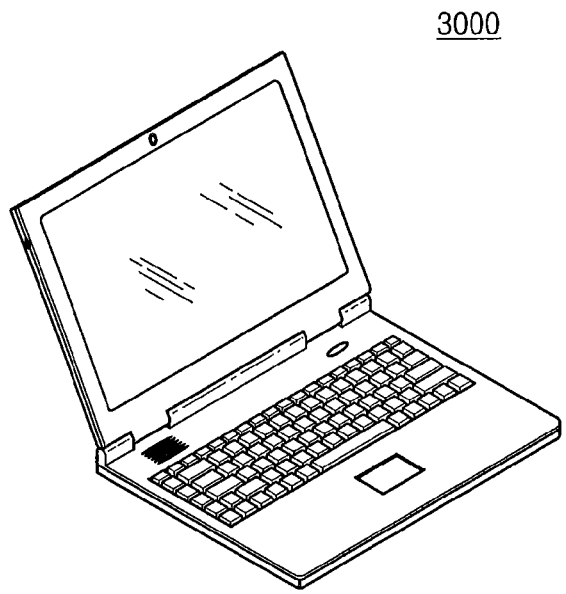
Figure 16:
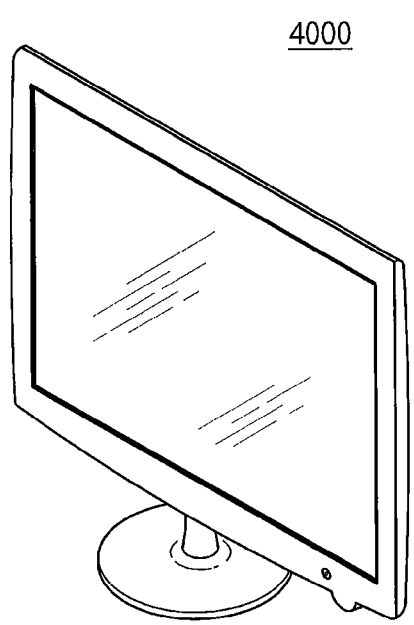
Figure 17:
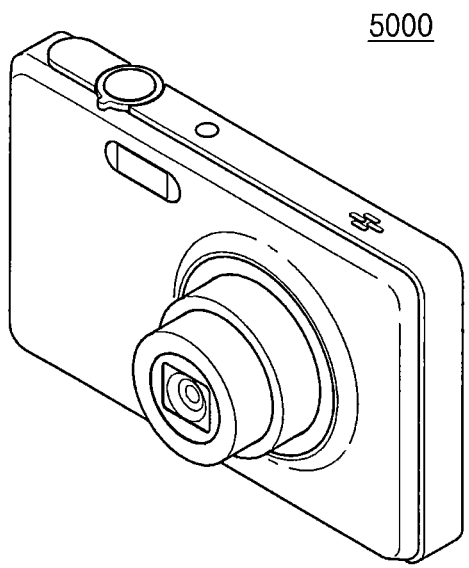

Referring to FIG. 12E, the second interlayer insulating layer 50 may be formed on the first interlayer insulating layer 40. The via-contacts 52 may be formed to penetrate the second and first interlayer insulating layers 50 and 40, the third dielectric layer 37, and the protection layer 22.

Referring again to FIG. 6A, the interconnections 54 covering the via-contacts 52 may be formed on the second interlayer insulating layer 50. The third interlayer insulating layer 60 covering the interconnections 54 may be formed on the second interlayer insulating layer 50. The color filter 81, the planarization layer 83, and the micro-lens 85 may be sequentially formed on the third interlayer insulating layer 60 of the pixel region PR1.

FIGS. 13 to 17 illustrate examples of multimedia devices implemented with image sensors according to some embodiments of the inventive concepts.

The image sensor according to some embodiments of the inventive concepts may be applied to various multimedia devices having an image photographing function. For example, the image sensor of some embodiments of the inventive concepts may be applied to a mobile and/or smart phone 1000 illustrated in FIG. 13 and/or a tablet and/or smart tablet 2000 illustrated in FIG. 14. In addition, the image sensor according to the aforementioned embodiments may be applied to a notebook computer 3000 illustrated in FIG. 15 and/or a television or smart television 4000 illustrated in FIG. 16. Furthermore, the image sensor according to the aforementioned embodiments may be applied to a digital camera or camcorder 5000 illustrated in FIG. 17.

Figure 18:
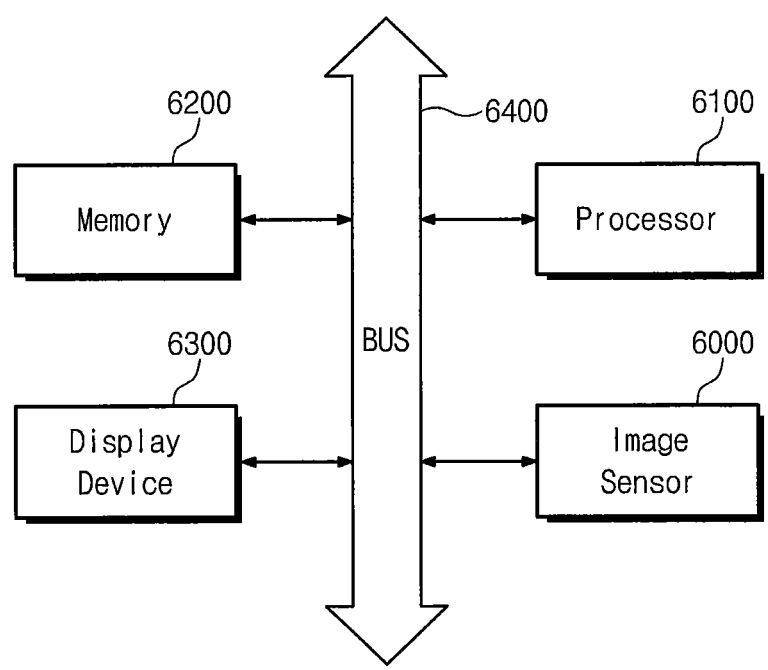
FIG. 18 is a schematic block diagram illustrating an image processing system including an image sensor according to embodiments of the inventive concepts.

FIG. 18 is a schematic block diagram illustrating an image processing system including an image sensor according to some embodiments of the inventive concepts.

The electronic device may be a digital camera and/or a mobile device. Referring to FIG. 18, a digital camera system may include an image sensor 6000, a processor 6100, a memory device 6200, a display device 6300, and a system bus 6400. The image sensor 6000 may capture external image information in response to control signals of the processor 6100. The image sensor 6000 may include at least one of the image sensors of the aforementioned embodiments of the inventive concepts. The processor 6100 may store the captured image information in the memory device 6200 through the system bus 6400. The process 6100 may display the image information stored in the memory device 6200 on the display device 6300.

According to some embodiments of the inventive concepts, the image sensor includes the light shielding layer that shields the light provided toward the charge storage region. The first thickness of the first portion, covering the sidewalls of the shutter gate, of the light shielding layer is greater than the second thickness of the second portion, covering the top surface of the shutter gate, of the light shielding layer. Thus, it is possible to effectively prevent the light which is provided toward the charge storage region along the sidewalls of the shutter gate.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. An image sensor comprising:
a substrate;
a photoelectric conversion element that is disposed in the substrate;
a first storage region that is disposed in the substrate and that is spaced apart from the photoelectric conversion element;
a gate that is on the first storage region; a light shielding layer that covers the gate;
a first dielectric layer that is between the gate and the light shielding layer and that extends onto a top surface of the substrate;
an interlayer insulating structure on the light shielding layer and the substrate; and
a micro-lens that is on the interlayer insulating structure and that overlaps with the photoelectric conversion element, wherein the light shielding layer comprises: a first portion that is on a sidewall of the gate; and a second portion that is on a top surface of the gate, wherein the first portion of the light shielding layer has a first thickness corresponding to a vertical height from a bottom surface of the first portion to a top surface of the first portion, wherein the first thickness of the first portion of the light shielding layer is greater than a second thickness of the second portion of the light shielding layer, wherein a top surface of a first portion of the first dielectric layer disposed below the light shielding layer is recessed relative to a top surface of a second portion of the first dielectric layer exposed by the light shielding layer, and wherein the first dielectric layer is a single layer.

2. The image sensor of claim 1, wherein the top surface of the first portion of the light shielding layer is coplanar with a top surface of the second portion of the light shielding layer.

3. The image sensor of claim 1, wherein a thickness of the first portion of the first dielectric layer is smaller than a thickness of the second portion of the first dielectric layer.

4. The image sensor of claim 1, further comprising a second dielectric layer disposed on the second portion of the first dielectric layer.

5. The image sensor of claim 4, wherein the first dielectric layer further comprises a third portion disposed between the gate and the first portion of the first dielectric layer, and
wherein the second dielectric layer is further disposed between the third portion of the first dielectric layer and the light shielding layer.

6. The image sensor of claim 5, wherein at least a portion of of the first portion of the light shielding layer is in contact with the first portion of the first dielectric layer.

7. The image sensor of claim 4, wherein the first portion of the light shielding layer comprises: a first bottom surface; and a second bottom surface that is between the first bottom surface and the gate,
wherein the first bottom surface is positioned at a lower level than a top surface of the second dielectric layer, and
wherein the second bottom surface is coplanar with the top surface of the second dielectric layer.

8. The image sensor of claim 6, wherein the dielectric layer further comprises: a third dielectric layer that is stacked on the second dielectric layer.

9. The image sensor of claim 8, wherein the first portion of the light shielding layer that is at a side of the gate comprises: a first bottom surface that is positioned at a lower level than a top surface of the third dielectric layer; and a second bottom surface that is disposed between the gate and the first bottom surface,
wherein the second bottom surface is coplanar with the top surface of the third dielectric layer, and
wherein the first portion of the light shielding layer that is at another side of the gate comprises: a third bottom surface that is coplanar with the top surface of the third dielectric layer.

10. The image sensor of claim 1, wherein the first dielectric layer includes a silicon nitride layer.

11. The image sensor of claim 4, wherein the second dielectric layer includes a silicon oxide layer.

12. The image sensor of claim 1, further comprising:
a separation region in the substrate between the photoelectric conversion element and a side of the first storage region;

a well region in the substrate under the first storage region; and a second storage region in the substrate and spaced apart from another side of the first storage region.

13. The image sensor of claim 12, wherein the gate comprises a shutter gate, the image sensor further comprising:

a transfer gate that is on the substrate between the first storage region and the second storage region, and wherein the transfer gate is exposed by the light shielding layer.

14. The image sensor of claim 12, wherein the gate comprises a shutter gate, the image sensor further comprising:

a transfer gate that is on the substrate between the first storage region and the second storage region, wherein the light shielding layer extends onto a top surface of the transfer gate.

15. An image sensor comprising:

a substrate including a pixel region and a peripheral circuit region;

a photoelectric conversion element that is in the pixel region of the substrate;

a storage region that is disposed in the pixel region of the substrate and that is spaced apart from the photoelectric conversion element;

a shutter gate that is on the storage region in the pixel region; a peripheral circuit gate that is in the peripheral circuit region;

a light shielding layer that includes a first portion that covers a sidewall of the shutter gate and a second portion that covers a top surface of the shutter gate;

a first dielectric layer that is between the shutter gate and the light shielding layer and that is on the peripheral circuit gate;

an interlayer insulating structure that covers the light shielding layer on the substrate and a portion of the dielectric layer that is in the peripheral circuit region;

a micro-lens that is on the interlayer insulating structure and that overlaps with the photoelectric conversion element; and a color filter that is in the interlayer insulating structure and that is between the micro-lens and the photoelectric conversion element, wherein the first portion of the light shielding layer has a first thickness corresponding to a vertical height from a bottom surface of the first portion to a top surface of the first portion, and wherein the first thickness of the first portion of the light shielding layer is greater than a second thickness of the second portion of the light shielding layer, wherein a first top surface of a first portion of the first dielectric layer disposed below the light shielding layer is recessed relative to a top surface of a second portion of the first dielectric layer exposed by the light layer, and wherein the first dielectric layer is a single layer.

16. The image sensor of claim 15, wherein the storage region comprises a first storage region, the sensor further comprising:

a separation region in the substrate between the photoelectric conversion element and a side of the first storage region;

a well region in the substrate under the first storage region;

a second storage region in the substrate and spaced apart from another side of the first storage region; and a transfer gate that is on the substrate between the first storage region and the second storage region.

17. The image sensor of claim 16, wherein the light shielding layer extends onto a top surface of the transfer gate, and wherein a thickness of the first portion of the first dielectric layer is smaller than a thickness of the second portion of the first dielectric layer.

18. The image sensor of claim 15, further comprising a second dielectric layer disposed on the second portion of the first dielectric layer and between a portion of the first portion of the first dielectric layer and the light shielding layer, and wherein at least a portion of the first portion of the light shielding layer is in contact with an other portion of the first portion of the first dielectric layer.

19. The image sensor of claim 15, further comprising a second dielectric layer disposed on the second portion of the first dielectric layer and between a portion of the first portion of the first dielectric layer and the light shielding layer, wherein the first portion of the light shielding layer comprises: a first bottom surface; and a second bottom surface that is between the first bottom surface and the shutter gate, wherein the first bottom surface is positioned at a lower level than a top surface of the second dielectric layer, and wherein the second bottom surface is coplanar with the top surface of the second dielectric layer.

20. An image sensor comprising:

a substrate;

a storage region that is disposed in the substrate;

a gate that is on the storage region;

a light shielding layer that covers the gate; and a dielectric layer that is between the gate and the light shielding layer and that extends onto a top surface of the substrate;

wherein the light shielding layer comprises: a first portion that is on a sidewall of the gate; and a second portion that is on a top surface of the gate, wherein the first portion of the light shielding layer has a first thickness corresponding to a vertical height from a bottom surface of the first portion to a top surface of the first portion, wherein the first thickness of the first portion of the light shielding layer is greater than a second thickness of the second portion of the light shielding layer, wherein a top surface of a first portion of the dielectric layer disposed below the light shielding layer is coplanar with a top surface of a second portion of the dielectric layer exposed by the light shielding layer, and wherein the dielectric layer is a single layer.

* * * * *